United States Patent
Sato et al.

(10) Patent No.: US 12,247,299 B2
(45) Date of Patent: Mar. 11, 2025

(54) TREATMENT LIQUID FOR SEMICONDUCTOR WITH RUTHENIUM AND METHOD OF PRODUCING THE SAME

(71) Applicant: TOKUYAMA CORPORATION, Yamaguchi (JP)

(72) Inventors: Tomoaki Sato, Yamaguchi (JP); Yuki Kikkawa, Yamaguchi (JP); Takafumi Shimoda, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 0 days.

(21) Appl. No.: 18/139,559

(22) Filed: Apr. 26, 2023

(65) Prior Publication Data

US 2023/0257887 A1   Aug. 17, 2023

Related U.S. Application Data

(62) Division of application No. 17/261,387, filed as application No. PCT/JP2020/026635 on Jul. 8, 2020, now Pat. No. 11,674,230.

(30) Foreign Application Priority Data

| Sep. 27, 2019 | (JP) | 2019-176727 |
| Oct. 23, 2019 | (JP) | 2019-193081 |
| Nov. 22, 2019 | (JP) | 2019-211875 |
| Mar. 16, 2020 | (JP) | 2020-045869 |

(51) Int. Cl.
C23F 1/40       (2006.01)
H01L 21/306     (2006.01)

(52) U.S. Cl.
CPC .......... *C23F 1/40* (2013.01); *H01L 21/30604* (2013.01)

(58) Field of Classification Search
None
See application file for complete search history.

(56) References Cited

U.S. PATENT DOCUMENTS

| 6,161,195 | A | 12/2000 | Konishi et al. | |
| 8,114,343 | B1 * | 2/2012 | Smith | C01B 11/06 |
| | | | | 252/396 |
| 10,361,092 | B1 | 7/2019 | Roberts et al. | |
| 2002/0060202 | A1 | 5/2002 | Fukunaga et al. | |
| 2003/0017419 | A1 | 1/2003 | Futase et al. | |
| 2005/0092351 | A1 | 5/2005 | Saito et al. | |
| 2009/0120458 | A1 | 5/2009 | Hao | |
| 2012/0256122 | A1 | 10/2012 | Sato et al. | |
| 2014/0076355 | A1 | 3/2014 | Hirabayashi et al. | |
| 2016/0130500 | A1 | 5/2016 | Chen et al. | |
| 2017/0222138 | A1 | 8/2017 | Park et al. | |
| 2020/0354632 | A1 | 11/2020 | Sugimura et al. | |

FOREIGN PATENT DOCUMENTS

| EP | 3181726 A1 * | 6/2017 |
| EP | 3 726 565 | 10/2020 |
| JP | 5-314019 | 11/1993 |
| JP | 2002-161381 | 6/2002 |
| JP | 2008-42014 | 2/2008 |
| JP | 2011-503326 | 1/2011 |
| JP | 2014-62297 | 4/2014 |
| JP | 2019002062 A * | 1/2019 |
| TW | 201504397 | 2/2015 |
| WO | 2011/074601 | 6/2011 |
| WO | 2016/068183 | 5/2016 |
| WO | 2019/142788 | 7/2019 |
| WO | 2019/150990 | 8/2019 |
| WO | 2019/151144 | 8/2019 |
| WO | 2019/151145 | 8/2019 |

OTHER PUBLICATIONS

Machine English translation of JP 2019002062 A; 2019. (Year: 2019).*
Machine English translation of EP 3181726; 2017 (Year: 2017).*
International Search Report for PCT/JP2020/026635, dated Oct. 13, 2020.
International Search Report issued Nov. 17, 2020 in International (PCT) Application No. PCT/JP2020/035677.
Office Action issued Jun. 4, 2021 in Taiwanese Patent Application No. 109133196.
Office Action issued Aug. 5, 2022, U.S. Appl. No. 17/266,283.
Barak et al., "Effect of Phase-Transfer Catalysis on the Selectivity of Hydrogen Peroxide Oxidation of Aniline", Journal of Organic Chemistry, 1989, vol. 54, No. 14, pp. 3484-3486.
Office Action issued Aug. 1, 2023 in corresponding Singapore Patent Application No. 11202203094Y.

* cited by examiner

*Primary Examiner* — Shamim Ahmed
(74) *Attorney, Agent, or Firm* — Wenderoth, Lind & Ponack, L.L.P.

(57) ABSTRACT

Provided is a treatment liquid for a semiconductor with ruthenium, containing a hypobromite ion. Also provided is a treatment liquid for a semiconductor with ruthenium, containing at least a bromine-containing compound, an oxidizing agent, a basic compound, and water which are added and mixed, wherein the liquid has the bromine-containing compound added in an amount of 0.01 mass % or more and less than 2 mass % as a bromine element content with respect to the total mass of the liquid, has the oxidizing agent added in an amount of 0.1 mass % or more and 10 mass % or less with respect to the total mass, and has a pH of 8 or more and 14 or less. Further provided is a method of producing a treatment liquid for a semiconductor with ruthenium, including a step of mixing a bromine-containing compound with a solution containing a hypochlorous acid compound and a basic compound.

6 Claims, No Drawings

TREATMENT LIQUID FOR SEMICONDUCTOR WITH RUTHENIUM AND METHOD OF PRODUCING THE SAME

BACKGROUND OF THE INVENTION

Field of the Invention

The present invention relates to a treatment liquid used to carry out etching or the like on ruthenium in a semiconductor wafer containing the ruthenium in production processes of semiconductor elements.

Background Art

In recent years, microfabrication design has been promoted for the design rule for semiconductor elements, and thus the wiring resistance tends to increase. As a result of the increase in wiring resistance, the high-speed operation of a semiconductor element is markedly impaired, thus making it necessary to take countermeasures. In view of this, a desired wiring material is a wiring material having lower electromigration resistance and a lower resistance value than conventional wiring materials.

Ruthenium has higher electromigration resistance than aluminum and copper which are conventional wiring materials, and ruthenium can decrease the resistance value of the wiring, thus attracting attention particularly as a wiring material for which the design rule for semiconductor elements is 10 nm or less. Not only in cases where ruthenium is used as a wiring material but also in cases where copper is used as a wiring material, ruthenium can prevent electromigration, and thus, using ruthenium as a barrier metal for copper wiring is under study.

In cases where ruthenium is selected as a wiring material in a wiring formation step of a semiconductor element, the wiring is formed by dry or wet etching in the same manner as in cases where a conventional wiring material is used. However, ruthenium is difficult to remove by dry etching with etching gas or etching by CMP polishing, and thus, more precise etching is desired; specifically, wet etching is attracting attention.

In cases where ruthenium is subjected to wet etching, the dissolution rate, in other words, etching rate of ruthenium is important. If the etching rate is high, ruthenium can be dissolved in a short time, thus making it possible to increase the number of wafers to be treated per unit time.

In cases where ruthenium is subjected to wet etching under alkaline conditions, ruthenium is dissolved, for example, in the form of $RuO_4^-$ or $RuO_4^{2-}$ in a treatment liquid. $RuO_4^-$ or $RuO_4^{2-}$ is changed to $RuO_4$ in a treatment liquid, and part of the $RuO_4$ is gasified and released into a gas phase. $RuO_4$ is strongly oxidative, and thus, not only is harmful to the human body but also is easily reduced to generate $RuO_2$ particles. In general, particles cause a decrease in the yield rate, and thus, are very problematic in semiconductor formation steps. Against such a background, it is very important to inhibit the generation of $RuO_4$ gas.

Patent Document 1 discloses that such a treatment liquid to be used to remove ruthenium from a semiconductor wafer by etching is that treatment liquid for a wafer having ruthenium which contains a hypochlorite ion and a solvent and has a pH of more than 7 and less than 12.0 at 25° C. The liquid contains a hypochlorite ion, and is shown to be capable of removing ruthenium and tungsten sticking to the end face portion and back face portion of a semiconductor wafer.

Patent Document 2 describes a ruthenium metallic etching composition characterized by being formed by adding and mixing a bromine-containing compound, an oxidizing agent, a basic compound, and water, and has the bromine-containing compound added in an amount of 2 to 25 mass % as a bromine element content with respect to the total mass of the composition, the oxidizing agent added in an amount of 0.1 to 12 mass %, and a pH of 10 or more and less than 12.

CITATION LIST

Patent Documents

Patent Document 1: WO 2019/142788
Patent Document 2: WO 2011/074601

SUMMARY OF THE INVENTION

In order to remove ruthenium from a semiconductor wafer having ruthenium by etching, it is important to satisfy both the etching rate of ruthenium and the inhibition of $RuO_4$ gas. However, the present inventors' studies have revealed that the conventional treatment liquids described in the prior art documents have room for improvement in the below-mentioned respects.

For example, Patent Document 1 describes a treatment liquid having a pH of more than 7 and less than 12.0 as a treatment liquid for a wafer having ruthenium. The treatment liquid described in Patent Document 1 has a sufficient etching rate of ruthenium, but nothing is mentioned about $RuO_4$ gas, and actually, the method described in Patent Document 1 was not capable of inhibiting the generation of $RuO_4$ gas. In other words, for the treatment liquid of wafer having ruthenium described in Patent Document 1, it is difficult to satisfy both the etching rate of ruthenium and the control of $RuO_4$ gas.

A ruthenium metallic etching composition described in Patent Document 2 is characterized by having a pH of 10 or more and less than 12, but in this pH range, etching of ruthenium is accompanied by the generation of $RuO_4$ gas, and thus, the composition has room for improvement. In addition, Patent Document 2 mentions nothing about the inhibition of $RuO_4$ gas, and actually, the method described in Patent Document 2 was not capable of inhibiting the generation of $RuO_4$ gas. In addition, the etching composition has a problem in that the composition has poor chemical liquid stability and greatly varies the etching rate of ruthenium with time. Furthermore, in the method described as a method of preparing the treatment liquid, the bromine-containing compound is oxidized by the oxidizing agent under acidic conditions to obtain an oxide, which is then mixed with a basic compound to have a pH suitably adjusted to basicity, but the method has room for improvement in the handling of the treatment liquid, for example, because the oxide and the basic compound are mixed and allowed to stand for several hours until bromine gas is generated, and because a high concentration of the basic compound needs to be added in a large amount to adjust the pH from acidity to basicity. Accordingly, the present invention has been made in view of the above-mentioned background technology, and an object of the present invention is to provide a treatment liquid and a method of producing the same, wherein the treatment liquid makes it possible to etch, at a sufficient rate, ruthenium sticking to the front face, end face portion, and back face portion of a semiconductor wafer, to allow the rate to have excellent stability, and to inhibit the generation of $RuO_4$ gas.

Solution to Problem

To solve the above-mentioned problems, the present inventors have made studies vigorously. Then, the present inventors have discovered that treating ruthenium with a treatment liquid containing a hypobromite ion makes it possible to etch ruthenium at a high rate. Furthermore, the present inventors have discovered that a bromine-containing compound added to an alkaline treatment liquid is oxidized by an oxidizing agent in the treatment liquid to become a bromine oxide, thus making it possible to etch ruthenium at a high rate. The present inventors have further discovered that suitably selecting the pH range, the concentration range of the bromine-containing compound, and the concentration range of the oxidizing agent makes it possible to keep the sufficient etching rate stable and inhibit the generation of $RuO_4$ gas; and have come to complete the present invention.

In other words, the present invention is constituted by the below-mentioned aspects.

Aspect 1: a treatment liquid for a semiconductor with ruthenium, containing a hypobromite ion.

Aspect 2: the treatment liquid for a semiconductor according to Aspect 1, wherein the hypobromite ion content is 0.001 mol/L or more and 0.20 mol/L or less.

Aspect 3: the treatment liquid for a semiconductor according to Aspect 1 or 2, wherein the hypobromite ion content is 0.01 mol/L or more and 0.10 mol/L or less.

Aspect 4: the treatment liquid for a semiconductor according to any one of Aspects 1 to 3, wherein the treatment liquid for a semiconductor further contains an oxidizing agent, and the oxidation-reduction potential of the oxidizing agent exceeds the oxidation-reduction potential of the hypobromite ion/$Br^-$ system.

Aspect 5: the treatment liquid for a semiconductor according to Aspect 4, wherein the oxidizing agent contained in the treatment liquid for a semiconductor is a hypochlorite ion or ozone.

Aspect 6: the treatment liquid for a semiconductor according to any one of Aspects 1 to 5, further containing a tetraalkylammonium ion.

Aspect 7: the treatment liquid for a semiconductor according to Aspect 6, wherein the tetraalkylammonium ion is a tetramethylammonium ion.

Aspect 8: the treatment liquid for a semiconductor according to any one of Aspects 1 to 7, wherein the proportion of the hypobromite ion in 1 mol of bromine element contained in the treatment liquid for a semiconductor is more than 0.5 mol.

Aspect 9: the treatment liquid for a semiconductor according to any one of Aspects 1 to 8, wherein the treatment liquid has a pH of 8 or more and 14 or less.

Aspect 10: the treatment liquid for a semiconductor according to any one of Aspects 1 to 9, wherein the treatment liquid has a pH of 12 or more and less than 13.

Aspect 11: a treatment liquid for a semiconductor with ruthenium, containing at least a bromine-containing compound, an oxidizing agent, a basic compound, and water, wherein the treatment liquid has the bromine-containing compound added in an amount of 0.008 mass % or more and less than 10 mass % as a bromine element content with respect to the total mass of the treatment liquid, has the oxidizing agent added in an amount of 0.1 mass ppm or more and 10 mass % or less with respect to the total mass, and has a pH of 8 or more and 14 or less.

Aspect 12: the treatment liquid for a semiconductor with ruthenium according to Aspect 11, having the bromine-containing compound added in an amount of 0.08 mass % or more and less than 2.0 mass % as a bromine element content.

Aspect 13: the treatment liquid for a semiconductor with ruthenium according to Aspect 11 or 12, having the bromine-containing compound added in an amount of 0.01 mass % or more and less than 2 mass % as a bromine element content, and having the oxidizing agent added in an amount of 0.1 mass % or more and 10 mass % or less.

Aspect 14: the treatment liquid for a semiconductor according to any one of Aspects 11 to 13, wherein the ruthenium is a ruthenium metal or a ruthenium alloy.

Aspect 15: the treatment liquid for a semiconductor according to any one of Aspects 11 to 14, wherein the oxidizing agent is a hypochlorous acid compound or ozone.

Aspect 16: the treatment liquid for a semiconductor according to any one of Aspects 11 to 15, wherein the bromine-containing compound is a bromine salt or hydrogen bromide.

Aspect 17: the treatment liquid for a semiconductor according to Aspect 16, wherein the bromine salt is a tetraalkylammonium bromide.

Aspect 18: the treatment liquid for a semiconductor according to Aspect 17, wherein the tetraalkylammonium bromide is a tetramethylammonium bromide.

Aspect 19: the treatment liquid for a semiconductor according to any one of Aspects 11 to 18, wherein the basic compound is a tetramethylammonium hydroxide.

Aspect 20: the treatment liquid for a semiconductor according to any one of Aspects 11 to 19, wherein the pH is 12 or more and 14 or less.

Aspect 21: the treatment liquid for a semiconductor according to any one of Aspects 11 to 20, wherein the pH is 12 or more and less than 13.

Aspect 22: the treatment liquid for a semiconductor according to Aspect 14, wherein the ruthenium metal contains 70 at. % or more of ruthenium.

Aspect 23: the treatment liquid for a semiconductor according to Aspect 14, wherein the ruthenium metal is a metallic ruthenium.

Aspect 24: the treatment liquid for a semiconductor according to Aspect 14, wherein the ruthenium alloy contains 70 at. % or more and 99.99 at. % or less of ruthenium.

Aspect 25: the treatment liquid for a semiconductor according to any one of Aspects 11 to 24, wherein the proportion of the hypobromite ion in 1 mol of bromine element contained in the treatment liquid for a semiconductor is more than 0.5 mol.

Aspect 26: a method of producing the treatment liquid for a semiconductor according to any one of Aspects 11 to 25, including a step of mixing the bromine-containing compound and a solution containing both the oxidizing agent and the basic compound.

Aspect 27: a method of producing the treatment liquid for a semiconductor according to any one of Aspects 11 to 25, including a step of mixing the bromine-containing compound into an aqueous solution of both the oxidizing agent and the basic compound.

Aspect 28: a method of treating a substrate, including the steps of: producing a treatment liquid for a semiconductor by the production method according to Aspect 26 or 27; and then using the treatment liquid for a semiconductor to etch a ruthenium metal film and/or a ruthenium alloy film deposited on the substrate.

Aspect 29: a method of producing a treatment liquid for a semiconductor with ruthenium, including a step of mixing a hypobromous acid, a hypobromite, a bromine water, or a bromine gas with a solution containing a basic compound.

Aspect 30: a method of producing a treatment liquid for a semiconductor with ruthenium, including a step of mixing a bromine-containing compound with a solution containing a hypochlorous acid compound and a basic compound.

Aspect 31: the method of producing a treatment liquid for a semiconductor according to Aspect 30, wherein a step of mixing a bromine-containing compound with a solution containing a hypochlorous acid compound and a basic compound is a step in which the bromine-containing compound is added to and mixed into the solution containing the hypochlorous acid compound and the basic compound.

Aspect 32: the method of producing a treatment liquid for a semiconductor according to any one of Aspects 29 to 31, wherein the solution is an aqueous solution.

Aspect 33: the production method according to any one of Aspects 29 to 32, wherein the ruthenium is a ruthenium metal or a ruthenium alloy.

Aspect 34: the method of producing a treatment liquid for a semiconductor according to any one of Aspects 29 to 33, wherein the basic compound is a tetramethylammonium hydroxide.

Aspect 35: the method of producing a treatment liquid for a semiconductor according to any one of Aspects 30 to 34, wherein the bromine-containing compound is a bromine salt or hydrogen bromide.

Aspect 36: the method of producing a treatment liquid for a semiconductor according to Aspect 35, wherein the bromine salt is an onium bromide.

Aspect 37: the method of producing a treatment liquid for a semiconductor according to Aspect 36, wherein the onium bromide is a quaternary onium bromide or a tertiary onium bromide.

Aspect 38: the method of producing a treatment liquid for a semiconductor according to Aspect 37, wherein the quaternary onium bromide is a tetraalkylammonium bromide.

Aspect 39: the method of producing a treatment liquid for a semiconductor according to Aspect 38, wherein the tetraalkylammonium bromide is produced from a tetraalkylammonium hydroxide and a bromide ion.

Aspect 40: the method of producing a treatment liquid for a semiconductor according to Aspect 38 or 39, wherein the tetraalkylammonium bromide is produced from a tetraalkylammonium hydroxide and hydrogen bromide.

Aspect 41: the method of producing a treatment liquid for a semiconductor according to Aspect 35, wherein the bromine salt is ammonium bromide, sodium bromide, or potassium bromide.

Aspect 42: the method of producing a treatment liquid for a semiconductor according to any one of Aspects 30 to 41, wherein the solution containing the hypochlorous acid compound is a tetraalkylammonium hypochlorite solution.

Aspect 43: the method of producing a treatment liquid for a semiconductor according to Aspect 42, including a step of producing the tetraalkylammonium hypochlorite solution, wherein the step includes a preparation step of providing a tetraalkylammonium hydroxide solution and a reaction step of contacting the tetraalkylammonium hydroxide solution with chlorine, and wherein the concentration of carbon dioxide in the gas phase portion in the reaction step is 100 vol ppm or less, and the pH of the liquid phase portion in the reaction step is 10.5 or more.

Aspect 44: the method of producing a treatment liquid for a semiconductor according to Aspect 43, wherein the carbon number of each alkyl group of the tetraalkylammonium hydroxide provided in the preparation step is 1 to 10.

Aspect 45: the method of producing a treatment liquid for a semiconductor according to Aspect 43 or 44, wherein the reaction temperature in the reaction step is −35° C. or more and 25° C. or less.

Aspect 46: the method of producing a treatment liquid for a semiconductor according to any one of Aspects 43 to 45, wherein the concentration of carbon dioxide in the tetraalkylammonium hydroxide solution in the reaction step is 0.001 ppm or more and 500 ppm or less.

Effects of the Invention

The present invention makes it possible to subject ruthenium to wet etching stably at a sufficiently high rate and inhibit the generation of $RuO_4$ gas in semiconductor formation steps. This makes it possible not only to enhance the wafer treatment efficiency per unit time, but also to inhibit the yield rate from being decreased by $RuO_2$ particles, and to carry out treatment safe for the human body, thus satisfying both the production cost and safety.

Furthermore, the method according to the present invention makes it possible to directly oxidize a bromine-containing compound with an oxidizing agent in an alkaline treatment liquid and thus promptly produce bromine, hypobromous acid, hypobromite ion, bromous acid, bromite ion, bromic acid, bromate ion, perbromic acid, and perbromate ion. A treatment liquid produced in this manner contains a hypobromite ion, thus making it possible to etch ruthenium immediately without waiting the generation of bromine gas for a long time and to shorten the time required for semiconductor production.

Furthermore, the pH of the treatment liquid does not need to be adjusted from acidity to alkalinity, thus making it possible to significantly decrease the amount of the basic compound to be added to the treatment liquid, and making the handling of the treatment liquid easier.

DESCRIPTION OF THE EMBODIMENTS (Treatment Liquid for a Semiconductor)

The treatment liquid according to the present invention is characterized by containing a hypobromite ion ($BrO^-$). The hypobromite ion is a strongly oxidative oxidizing agent, and the treatment liquid containing a hypobromite ion according to the present invention makes it possible to etch ruthenium at a high rate under alkaline conditions. Furthermore, suitably selecting the pH of the treatment liquid and the kind and concentration of the oxidizing agent makes it possible to etch ruthenium at a stable etching rate while the generation of $RuO_4$ gas is inhibited. Because of this, the treatment liquid according to the present invention can be suitably used in an etching step, a residue removal step, a washing step, a CMP step, and the like in semiconductor production processes. As used herein, a semiconductor with ruthenium refers to a semiconductor containing ruthenium.

Use of the treatment liquid according to the present invention makes it possible to inhibit the generation of $RuO_4$ gas and remove, at a sufficient etching rate, ruthenium sticking to the front face, end face portion, and back face portion of a semiconductor wafer. In the present invention, a sufficient etching rate refers to an etching rate of 10 Å/min or more. The etching rate of 10 Å/min or more for ruthenium makes it possible that the treatment liquid is suitably used in an etching step, a residue removal step, a washing step, a CMP step, and the like. In addition, the amount of $RuO_4$ gas generated when ruthenium is etched depends on the treatment conditions (for example, the amount of dissolved ruthenium, the volume of the treatment liquid used, the treatment temperature, the volume and material of a container or a chamber, and the like). Accordingly, in comparison of the generation amounts of $RuO_4$ gas, it is important to consider these conditions, and in a simplified manner, the amounts can be evaluated as the generation amounts per unit area of a wafer containing ruthenium. The generation amount of $RuO_4$ per unit area of a wafer containing ruthenium can be determined by: trapping the $RuO_4$ gas generated during etching in a suitable absorbing liquid (for example, an alkaline solution such as an aqueous NaOH solution), quantitating the amount of the ruthenium in the trapping liquid, and then dividing the amount by the area of the wafer used. Accordingly, the generation amounts of $RuO_4$ gas per unit area can be compared to verify the $RuO_4$ gas inhibition effect. A treatment liquid which generates a smaller amount of $RuO_4$ per unit area makes it possible to inhibit the generation of the $RuO_4$ gas and inhibit the generation of $RuO_2$ particles, and thus, can be suitably used for etching of ruthenium.

The treatment liquid in the present invention can etch ruthenium, but does not etch a metal such as copper, cobalt, titanium, platinum, titanium nitride, or tantalum nitride, or etches such a metal at a very low etching rate, compared with a ruthenium metal. Because of this, it is also possible to selectively etch a ruthenium metal without damaging a substrate material containing a metal of them in semiconductor production processes and the like.

In the present invention, that the etching rate of ruthenium is stable means that the rate at which ruthenium is etched with a treatment liquid containing a hypobromite ion does not change over time. Specifically, the meaning is that, in cases where a plurality of wafers having ruthenium are etched using the same treatment liquid (assuming that the number of wafers is n), the etching rate of ruthenium in the first wafer is substantially the same as the etching rate of ruthenium in the nth wafer. Here, being substantially the same means that the range of variation of the etching rate of ruthenium in the nth wafer with respect to the etching rate of ruthenium in the first wafer, in other words, an increase/decrease in the etching rate is within ±20%. In addition, a period of time during which an increase/decrease between the etching rate of ruthenium in the nth wafer and the etching rate of ruthenium in the first wafer is within ±20% is defined as the stability time of the etching rate. A suitable value as the stability time of the etching rate varies depending on the condition and production process under which a treatment liquid according to the present invention is used, and for example, a treatment liquid which allows the stability time of the etching rate to be one hour or more can be suitably used for semiconductor production processes. Considering the possibility of having enough time for handling of the treatment liquid and the possibility of setting the process time in a flexible manner, a treatment liquid allowing the stability time of the etching rate to be 10 hours or more is more preferable.

A treatment liquid which does not allow the etching rate of ruthenium to change over time or a treatment liquid which allows the stability time of the etching rate to be long makes it possible not only to subject ruthenium to etching stably using the treatment liquid in semiconductor production processes but also to reutilize (reuse) the treatment liquid, and thus, such a treatment liquid is excellent in terms of productivity and cost.

A hypobromite ion contained in a treatment liquid according to the present invention may be generated in the treatment liquid, or a hypobromite may be added to the treatment liquid. As used herein, a hypobromite refers to a salt containing a hypobromite ion or a solution containing the salt. To generate a hypobromite ion in the treatment liquid, for example, bromine gas can be sparged into the treatment liquid. In this case, the treatment liquid is preferably at 50° C. or less in terms of generating a hypobromite ion efficiently. Causing the treatment liquid to be at 50° C. or less makes it possible not only to generate a hypobromite ion efficiently but also to use the generated hypobromite ion to etch ruthenium stably. Furthermore, to dissolve a larger amount of bromine in the treatment liquid, the temperature of the treatment liquid is more preferably 30° C. or less, most preferably 25° C. or less. The lower limit of the temperature of the treatment liquid is not limited to any particular value, but the treatment liquid is preferably not frozen. Accordingly, the treatment liquid is preferably at −35° C. or more, more preferably −15° C. or more, most preferably 0° C. or more. The treatment liquid into which the bromine gas is sparged is not limited to any particular pH, but a treatment liquid having an alkaline pH value can be used to etch ruthenium immediately after a hypobromite ion is generated.

Furthermore, in cases where a hypobromite ion is generated by sparging bromine gas into a treatment liquid containing a bromide ion ($Br^-$), the treatment liquid enhances the solubility of the bromine gas ($Br_2$). This is because $Br_2$ dissolved in the treatment liquid reacts with Br and $Br_3^-$ to form a complex ion such as $Br_3^-$ and $Br_5^-$, and is stabilized in the treatment liquid. The treatment liquid containing $Br_2$, $Br^-$, $Br_3^-$, $Br_5^-$, and the like in larger amounts can generate a hypobromite ion in a larger amount, and thus, can be suitably used as a treatment liquid according to the present invention.

Oxidizing a bromine-containing compound with an oxidizing agent also makes it possible to produce a hypobromite ion in the treatment liquid.

To add a hypobromite ion in the form of a compound to the treatment liquid, it is only necessary to add a hypobromous acid, bromine water, and/or hypobromite. A suitable hypobromite is sodium hypobromite, potassium hypobromite, or tetraalkylammonium hypobromite; a hypobromous acid or tetraalkylammonium hypobromite is more suitable in terms of containing no metal ion which is problematic in semiconductor production.

The tetraalkylammonium hypobromite is easily obtained by passing bromine gas through a tetraalkylammonium hydroxide solution. Alternatively, the tetraalkylammonium hypobromite is obtained by mixing a hypobromous acid and a tetraalkylammonium hydroxide solution. Furthermore, the tetraalkylammonium hypobromite can be obtained also by using an ion exchange resin to cause a cation contained in a hypobromite such as sodium hypobromite to be replaced with a tetraalkylammonium ion.

The concentration of the hypobromite ion in a treatment liquid according to the present invention is not limited to any particular value as long as the value does not depart from the object of the present invention, and the concentration is preferably 0.001 mol/L or more and 0.20 mol/L or less as the amount of the bromine element contained in the hypobromite ion. The amount of less than 0.001 mol/L results in causing ruthenium to be etched at a low rate, and is not very practicable. In addition, the amount of more than 0.20 mol/L causes a hypobromite ion to be more likely to be decomposed, and thus, the etching rate of ruthenium results in being less likely to be stable. To etch ruthenium stably at a sufficient rate, the concentration of the hypobromite ion is preferably 0.001 mol/L or more and 0.20 mol/L or less, more preferably 0.005 mol/L or more and 0.20 mol/L or less, most preferably 0.01 mol/L or more and 0.10 mol/L or less, as the amount of the bromine element contained in a hypobromite ion.

To moderate a decrease in the etching rate of ruthenium and stabilize the etching rate, the proportion of hypobromite ions in 1 mol of bromine element contained in the treatment liquid is preferably more than 0.5 mol. As above-mentioned, a hypobromite ion is easily changed to Br$^-$ by the oxidization reaction or decomposition reaction of ruthenium. Br$^-$ does not etch ruthenium, and thus, for stable ruthenium etching, it is important to promptly oxidize Br in the treatment liquid into a hypobromite ion so as to keep a high concentration of chemical species (a hypobromite ion: BrO$^-$) having high ruthenium etching capability. In cases where the proportion of a hypobromite ion in 1 mol of bromine element contained in a treatment liquid according to the present invention is more than 0.5 mol, in other words, in cases where the bromine element more than half, in number, of all bromine element in the treatment liquid is present in the form of BrO$^-$, the concentration of the chemical species having ruthenium etching capability can be regarded as sufficiently high, and the etching rate of ruthenium is stabilized.

The concentration of a hypobromite ion in the treatment liquid can be verified using a widely known method. For example, ultraviolet and visible absorptiometry is used to easily verify absorption due to a hypobromite ion, and the hypobromite ion concentration can be determined from the intensity of an absorption peak (generally approximately 330 nm although depending on the pH, hypobromite ion concentration, or the like of the treatment liquid). In addition, the hypobromite ion concentration can be determined also by iodine titration. Besides, the hypobromite ion concentration can be determined from the oxidation-reduction potential (ORP) or pH of the treatment liquid. Measurement by ultraviolet and visible absorptiometry is most preferable in terms of making contactless and continuous measurement possible. In this regard, when the hypobromite ion concentration is measured by ultraviolet and visible absorptiometry and when absorption by (an)other chemical species is found, carrying out data processing, such as spectral splitting and baseline correction, and suitable selection of a reference enables the hypobromite ion concentration to be determined with sufficient accuracy.

The acid dissociation constant (pK$_a$) of a hypobromous acid (HBrO) and a hypobromite ion (BrO$^-$) is 8.6, and thus, HBrO and BrO$^-$ coexist in some cases depending on the pH of the treatment liquid, for example, in cases where the pH is low. In cases where the treatment liquid contains HBrO and BrO$^-$, the total concentration of HBrO and BrO$^-$ can be regarded as the above-mentioned hypobromite ion concentration.

The detail of the mechanism by which a hypobromite ion dissolves ruthenium is not necessarily clear, but the inference is that a hypobromite ion or hypobromous acid generated from a hypobromite ion oxidizes ruthenium in the treatment liquid to form $RuO_4$, $RuO_4^-$, or $RuO_4^{2-}$, which are dissolved in the treatment liquid. Causing ruthenium to be dissolved in the form of $RuO_4^-$ or $RuO_4^{2-}$ makes it possible to decrease the generation amount of $RuO_4$ gas and inhibit the generation of $RuO_2$ particles. To dissolve ruthenium in the form of $RuO_4^-$ or $RuO_4^{2-}$, the pH of the treatment liquid is preferably alkaline, the pH of the treatment liquid is more preferably 8 or more and 14 or less, the pH is still more preferably 12 or more and 14 or less, and the pH is most preferably 12 or more and less than 13. The treatment liquid having a pH of 12 or more and less than 13 causes ruthenium to be dissolved in the form of $RuO_4^-$ or $RuO_4^{2-}$ in the treatment liquid, thus making it possible to significantly decrease the generation amount of $RuO_4$ gas and inhibit the generation of $RuO_2$ particles. In addition, in cases where the pH of the treatment liquid is less than 8, ruthenium is more easily oxidized to $RuO_2$ or $RuO_4$, thus increasing the amount of $RuO_2$ particles and tending to increase the generation amount of $RuO_4$ gas. In addition, the pH of more than 14 causes ruthenium to be dissolved less easily, making it difficult to obtain a sufficient ruthenium etching rate, and thus, decreases the production efficiency in semiconductor production.

To adjust the pH of the treatment liquid, acid or alkali can be added to the treatment liquid. The acid may be either an inorganic acid or an organic acid, examples of which include hydrofluoric acid, hydrochloric acid, hydrobromic acid, nitric acid, sulfuric acid, peroxodisulfuric acid, carboxylic acids such as formic acid, and acetic acid; and besides, other widely known acids can be used for a treatment liquid for a semiconductor without any limitation. The alkali to be preferably used is an organic alkali, because such an alkali contains no metal ion problematic in semiconductor production. Examples of organic alkalis include a tetraalkylammonium hydroxide composed of a tetraalkylammonium ion and a hydroxide ion. Examples of the tetraalkylammonium hydroxide include tetramethylammonium hydroxide, tetraethylammonium hydroxide, tetrapropylammonium hydroxide, tetrabutylammonium hydroxide, and the like. Among these, the organic alkali is preferably tetraalkylammonium hydroxide, more preferably tetramethylammonium hydroxide, in terms of the large number of hydroxide ions per unit weight and in terms of being easily available in the form of a high purity product.

The above-mentioned tetraalkylammonium ions to be contained in the treatment liquid may be used singly or in combination of two or more kinds thereof.

A treatment liquid according to the present invention preferably contains an oxidizing agent. An oxidizing agent contained in the treatment liquid according to the present invention plays a role which is to cause a bromide ion (Br) generated by decomposition of a hypobromite ion to be oxidized back into a hypobromite ion.

When ruthenium is oxidized, the hypobromite ion is reduced to Br$^-$. In addition, hypobromite ions are naturally decomposed easily in the treatment liquid, and part thereof changes to Br$^-$. Furthermore, the decomposition of hypobromite ions is promoted by ultraviolet light and visible light, and part of the ions change to Br$^-$. Furthermore, the decomposition of the hypobromite ions is promoted by heating, contact with acid, or contact with metal, and thus, part of the ions changes Br$^-$. Br$^-$ generated by the reduction or decomposition of the hypobromite ions does not dissolve ruthenium, and thus, the promoted reduction or decomposition of the hypobromite ions decreases the etching rate of ruthenium. The treatment liquid containing a suitable oxidizing agent enables Br$^-$ generated by the reduction or decomposition to be oxidized into hypobromite ions, and makes it possible to moderate a decrease in the etching rate of ruthenium. In other words, the treatment liquid containing a hypobromite ion and a suitable oxidizing agent lengthens the stability time of the etching rate.

An oxidizing agent which may be contained in the treatment liquid is preferably such that the oxidation-reduction potential between the oxidizing agent and the chemical species generated by the reduction of the oxidizing agent exceeds the oxidation-reduction potential of the hypobromite ion/$Br^-$ system. Use of such an oxidizing agent enables Br to be oxidized into a hypobromite ion. The oxidation-reduction potential between the oxidizing agent which may be contained in the treatment liquid and the chemical species generated by the reduction of the oxidizing agent changes depending on the concentration of each of the oxidizing agent and the chemical species generated by the reduction of the oxidizing agent, the temperature and pH of the solution, and the like, but independent of these conditions, the oxidation-reduction potential between the oxidizing agent and the chemical species generated by the reduction of the oxidizing agent only needs to exceed the oxidation-reduction potential of the hypobromite ion/$Br^-$ system.

In addition, for the oxidizing agent which may be contained in the treatment liquid, the oxidation-reduction potential between the oxidizing agent and the chemical species generated by the reduction of the oxidizing agent is not limited to any particular upper limit as long as the upper limit does not depart from the object of the present invention. However, in cases where the oxidation-reduction potential is higher than the oxidation-reduction potential of the $RuO_4^-/RuO_4$ system (1.0 V vs. SHE), $RuO_4^-$ dissolved in the treatment liquid is oxidized into $RuO_4$ by the oxidizing agent, causing the possibility that the generation of $RuO_4$ gas increases. In such a case, suitably adjusting the amount of an oxidizing agent to be added to the treatment liquid and the timing of addition of the oxidizing agent makes it possible to inhibit the oxidation of $RuO_4^-$ into $RuO_4$ and control the generation amount of $RuO_4$ gas.

The oxidizing agent which may be contained in the treatment liquid according to the present invention does not contain any metal element which is problematic in semiconductor production, and thus, a hypochlorite ion or ozone is preferably utilized. Among these, a hypochlorite ion is more suitable in terms of the high solubility in the treatment liquid, the stable presence in the solution, and the easiness of the concentration adjustment.

A hypochlorite ion and ozone have the capability to reoxidize $Br^-$ into a hypobromite ion in an alkaline treatment liquid (having a pH of 8 or more and 14 or less). This is also understood from the fact that the oxidation-reduction potential of the hypochlorite ion/$Cl^-$ system is 0.89 V, and that the oxidation-reduction potential of the ozone/oxygen system is 1.24 V, but that the oxidation-reduction potential of the hypobromite ion/$Br^-$ system is 0.76 V. In this regard, the oxidation-reduction potential is a value with respect to a standard hydrogen electrode at a pH of 14 (at 25° C.). Accordingly, a treatment liquid according to the present invention containing a hypobromite ion, hypochlorite ion, or ozone oxidizes $Br^-$ into a hypobromite ion, whereby the concentration of the hypobromite ion in the treatment liquid can be kept high, thus making it possible to stabilize the etching rate of ruthenium.

An example in which a hypochlorite ion is used as an oxidizing agent is shown in Table 8. The Table shows that, at any pH, the oxidation-reduction potential of the hypochlorite ion/$Cl^-$ system is higher than that of the hypobromite ion/$Br^-$ system. As above-mentioned, the treatment liquid according to the present invention containing both a hypobromite ion and a hypochlorite ion lengthens the stability time of the etching rate of ruthenium, and thus, can be particularly suitably utilized. In contrast, use of an oxidizing agent which has a weak oxidative power in alkali, for example, hydrogen peroxide, does not make it possible to oxidize $Br^-$ into a hypochlorite ion efficiently, and thus, results in a low etching rate of ruthenium.

The concentration of the hypochlorite ion in a treatment liquid according to the present invention is not limited to any value as long as the value does not depart from the object of the present invention, and the concentration is preferably 0.1 mass % or more and 10 mass % or less. The concentration of hypochlorite ion which is less than 0.1 mass % is unable to oxidize $Br^-$ efficiently, resulting in decreasing the etching rate of ruthenium. In addition, the hypochlorite ion added in an amount of more than 10 mass % decreases the stability of the hypochlorite ion, and thus, is not suitable. The concentration of the oxidizing agent is more preferably 0.3 mass % or more and 7 mass % or less, most preferably 0.5 mass % or more and 4 mass % or less, in terms of satisfying both the inhibition of $RuO_4$ gas and the etching rate of ruthenium.

In addition, a higher proportion of a hypochlorite ion to a hypobromite ion causes the reaction between the hypochlorite ion and the hypobromite ion to promote a reaction for forming a bromic acid ion, and thus, decreases the hypobromite ion concentration.

The concentration of ozone in a treatment liquid according to the present invention is not limited to any value as long as the value does not depart from the object of the present invention, and the concentration is preferably 0.1 mass ppm or more and 1000 mass ppm (0.1 mass %) or less. The concentration of less than 0.1 mass ppm causes $Br^-$ to be oxidized into a hypobromite ion at a low rate, and thus, does not affect the etching rate of ruthenium. In addition, the ozone concentration is more preferably 1 mass ppm or more and 500 mass ppm or less, in terms of dissolving ozone in the treatment liquid stably. Furthermore, the ozone concentration of 5 mass ppm or more and 200 mass ppm or less makes it possible to oxidize $Br^-$ into a hypobromite ion efficiently, and is particularly preferable. In addition, any widely known method can be used, without any problem, as a method of generating ozone and a method of dissolving ozone in a treatment liquid. For example, electric discharge in a gas containing oxygen generates ozone, and the gas containing ozone is brought in contact with the treatment liquid, thus causing part or all of the ozone to be dissolved in the treatment liquid, whereby a treatment liquid containing ozone can be formed. Ozone may be brought in contact with a treatment liquid continuously or intermittently. Bringing ozone in contact with a treatment liquid before etching of ruthenium is started makes it possible that the treatment liquid undergoes a smaller decrease in the concentration of $BrO^-$ and achieves a stable etching rate. In cases where ozone is brought in contact with a treatment liquid which has etched ruthenium, in other words, a treatment liquid containing $RuO_4$, $RuO_4^-$, $RuO_4^{2-}$, or the like, bringing ozone, little by little, in contact with a treatment liquid intermittently can prevent an increase in the generation of $RuO_4$ gas.

The above-mentioned method of generating a hypochlorite ion is not limited to any particular method, and a hypochlorite ion generated by any method can be suitably used for a treatment liquid according to the present invention. Examples of methods which can be suitably used to generate a hypochlorite ion include adding hypochlorite, sparging chlorine gas, and the like. Among these, a method in which hypochlorite is added to a treatment liquid is more suitable because the method allows the concentration of a hypochlorite ion to be easily controlled, and allows the hypochlorite to be easily handled. Examples of such a hypochlorite include tetraalkylammonium hypochlorite, sodium hypochlorite, potassium hypochlorite, calcium hypochlorite, magnesium hypochlorite, and hypochlorous acid. Among these, tetraalkylammonium hypochlorite or hypochlorous acid is particularly suitable in terms of containing no metal which is problematic in semiconductor production, and tetraalkylammonium hypochlorite is most suitable in terms of being able to be present stably at a high concentration.

Suitable examples of the tetraalkylammonium hypochlorite include a tetraalkylammonium hypochlorite containing a tetraalkylammonium ion having 1 to carbon number per alkyl group. Specific examples thereof include tetramethylammonium hypochlorite, tetraethylammonium hypochlorite, tetrapropylammonium hypochlorite, tetrabutylammonium hypochlorite, tetrapentylammonium hypochlorite, and tetrahexylammonium hypochlorite; and tetramethylammonium hypochlorite and tetraethylammonium hypochlorite are more suitable in terms of having more hypochlorite ions per unit weight. Tetramethylammonium hypochlorite is easily available in the form of a high purity product, and thus, is most suitable.

A method of producing the tetramethylammonium hypochlorite is not limited to any particular method, and the tetramethylammonium hypochlorite produced by a widely known method can be used. For example, a tetramethylammonium hypochlorite which can be suitably used is produced by: a method in which chlorine is sparged into tetramethylammonium hydroxide; a method in which hypochlorous acid and tetramethylammonium hydroxide are mixed; a method in which an ion exchange resin is used to replace a cation in a hypochlorite solution with tetramethylammonium; a method in which a distillate of a solution containing hypochlorite and tetramethylammonium hydroxide are mixed; and the like.

In cases where a treatment liquid according to the present invention contains both a hypochlorite ion or ozone and $Br^-$, whether a hypochlorite ion or ozone continuously oxidizes $Br^-$ into $BrO^-$ depends on the quantitative ratio between the hypochlorite ion and $Br^-$ contained in the treatment liquid or the quantitative ratio between the ozone and $Br^-$ contained in the treatment liquid. In cases where the molar concentration of $Br^-$ present in the treatment liquid is higher than the molar concentration of a hypochlorite ion or ozone, all the amount of $Br^-$ cannot be oxidized into $BrO^-$. The molar concentration of a hypochlorite ion or ozone in the treatment liquid according to the present invention is preferably higher than the molar concentration of $Br^-$. In cases where $Br^-$ is oxidized into $BrO^-$ by passing a gaseous oxidizing agent such as ozone through a treatment liquid, the total number of moles of the gaseous oxidizing agent to be passed is desirably more than the number of moles of $Br^-$ contained in the treatment liquid.

Examples of methods of producing a hypobromite ion in a treatment liquid include a method in which a bromine-containing compound is oxidized by an oxidizing agent. The quantitative ratio between a bromine-containing compound and an oxidizing agent contained in the treatment liquid is preferably determined taking into consideration the stoichiometric ratio and reaction rate at which the bromine-containing compound and the oxidizing agent react to generate a hypobromite ion and the stoichiometric ratio and reaction rate at which Br and the oxidizing agent contained in the treatment liquid react to generate a hypobromite ion, but in reality, a plurality of factors complicatedly affect one another in these reactions, and thus, it is difficult to determine a suitable quantitative ratio of the bromine-containing compound to the oxidizing agent. However, if the ratio of a value obtained by dividing the concentration of the bromine-containing compound by the chemical equivalent (molar equivalent) of the bromine-containing compound to a value obtained by dividing the concentration of the oxidizing agent by the chemical equivalent (molar equivalent) of the oxidizing agent is in the range of from 0.001 to 100, not only $BrO^-$ can be efficiently generated from the bromine-containing compound by the oxidizing agent but also Br generated by the reduction reaction or decomposition reaction of $BrO^-$ can be reoxidized into $BrO^-$, and thus, the etching rate of ruthenium is stabilized.

For example, in cases where the bromine-containing compound is tetramethylammonium bromide and where the oxidizing agent is tetramethylammonium hypochlorite, the chemical equivalent (molar equivalent) of the bromine-containing compound and the chemical equivalent (molar equivalent) of the oxidizing agent are equal in the reaction between these chemical species, and thus, it is only necessary that the ratio of the molar concentration of the bromine-containing compound to the concentration of the oxidizing agent is in the range of from 0.001 to 100.

The quantitative ratio between a hypobromite ion and a hypochlorite ion contained in the treatment liquid is preferably determined taking into consideration the decrease rate of the hypobromite ion: to be more accurate, the rate at which $Br^-$ is generated by the reduction reaction and/or decomposition reaction of the hypobromite ion; and the rate of the reaction in which $Br^-$ is oxidized into $BrO^-$ by the hypochlorite ion. In reality, however, a plurality of factors complicatedly affect one another in these reactions, and thus, it is difficult to determine a suitable quantitative ratio between the hypobromite ion and the hypochlorite ion. However, if the ratio of the molar concentration of the hypobromite ion to the molar concentration of the hypochlorite ion (the molar concentration of the hypobromite ion/the molar concentration of the hypochlorite ion) is in the range of from 0.001 to 100, Br generated by the reduction reaction or decomposition reaction of $BrO^-$ can be reoxidized into $BrO^-$ by the hypochlorite ion, and thus, the etching rate of ruthenium is stabilized.

In the present invention, the treatment liquid for a semiconductor with ruthenium preferably has a pH of 8 or more and 14 or less. The treatment liquid having a pH of 8 or more and 14 or less makes it possible to etch ruthenium efficiently, stabilizes the etching rate of ruthenium, and furthermore, can be hopefully expected to decrease the generation amount of $RuO_4$ gas. The lower the pH, the higher the etching rate of ruthenium; but the lower the pH, the more the generation amount of $RuO_4$ gas. Accordingly, in treating a semiconductor wafer containing ruthenium, it is extremely important to select a pH which can satisfy both the etching rate and the inhibition of $RuO_4$ gas. From this viewpoint, a treatment liquid for a semiconductor with ruthenium in the present invention more preferably has a pH of 12 or more and 14 or less, still more preferably 12 or more and less than 13. Causing the treatment liquid to have a pH of 12 or more and less than 13 makes it possible to etch ruthenium at a sufficient rate and furthermore inhibit the generation of $RuO_4$ gas. The treatment liquid having a pH of less than 8 tends more to generate $RuO_2$ particles.

Ruthenium contained in a semiconductor wafer for which a treatment liquid according to the present invention is used may be formed by any method. To form a film of ruthenium, a method widely known in semiconductor production processes, for example, CVD, ALD, PVD, sputtering, or the like can be utilized. In the present invention, ruthenium refers to a ruthenium metal or a ruthenium alloy.

In the present invention, a "ruthenium metal" refers not only to a metal ruthenium but also to a ruthenium metal containing 70 at. % or more of ruthenium, to an oxide ($RuO_x$), nitride (RuN), or oxynitride (RuNO) of ruthenium, and to the like. As used herein, an oxide of ruthenium refers to ruthenium dioxide or diruthenium trioxide (trihydrate). In addition, a "ruthenium alloy" in the present invention refers to an alloy containing 70 at. % or more and 99.99 at. % or less of ruthenium and containing a metal which is other than ruthenium and whose concentration is higher than the concentration at which the metal is contained inevitably. In the present invention, a ruthenium metal and a ruthenium alloy are each described as ruthenium when it is not necessary to particularly distinguish them.

A ruthenium alloy may contain any metal besides ruthenium; examples of a metal contained in a ruthenium alloy include tantalum, silicon, copper, hafnium, zirconium, aluminum, vanadium, cobalt, nickel, manganese, gold, rhodium, palladium, titanium, tungsten, molybdenum, platinum, iridium, and the like; and the ruthenium alloy may contain an oxide, nitride, or silicide of any of these metals.

These rutheniums may be intermetallic compounds, ionic compounds, or complexes. In addition, ruthenium may be exposed on the surface of a wafer, or covered by another metal, metal oxide film, insulation film, resist, or the like. Even in cases where ruthenium is covered by another material, the $RuO_4$ gas generation inhibition effect is achieved when the ruthenium is brought in contact with a treatment liquid according to the present invention and caused to dissolve. Furthermore, if the ruthenium is not caused to dissolve actively, in other words, if the ruthenium is treated as an object of protection, a treatment liquid according to the present invention makes it possible to inhibit $RuO_4$ gas generated from the very slightly dissolved ruthenium.

For example, in a ruthenium wiring formation step, a treatment liquid according to the present invention is used as below-mentioned. First, a substrate composed of a semiconductor (for example, Si) is provided. The provided substrate is oxidized to form a silicon oxide film on the substrate. Then, an interlayer insulation film composed of a low dielectric constant (Low-k) film is formed, and viaholes are formed at predetermined intervals. After the viaholes are formed, ruthenium is embedded in the viaholes by thermal CVD to further form a ruthenium film. This ruthenium film is etched using a treatment liquid according to the present invention, and is thereby planarized while the generation of $RuO_4$ gas is inhibited. This makes it possible to form highly reliable ruthenium wiring in which $RuO_2$ particles are inhibited.

Another aspect of a treatment liquid according to the present invention is a treatment liquid containing at least a bromine-containing compound, an oxidizing agent, a basic compound, and water. The stepwise description follows below.

(Bromine-Containing Compound)

A bromine-containing compound to be used in a treatment liquid according to the present invention may be any compound, provided that the compound contains a bromine atom, and is oxidized by the below-mentioned oxidizing agent to generate bromine, a hypobromous acid, hypobromite ion, bromous acid, bromous acid ion, bromic acid, bromic acid ion, perbromic acid, perbromic acid ion, or bromide ion. Examples of compounds to be preferably used include at least one selected from the group consisting of a bromine salt and hydrogen bromide. As used herein, hydrogen bromide may be hydrogen bromide gas or hydrobromic acid which is an aqueous solution of hydrogen bromide. Examples of bromine salts include lithium bromide, sodium bromide, potassium bromide, rubidium bromide, cesium bromide, ammonium bromide, onium bromides, and the like. As used herein, an onium bromide refers to a compound formed of an onium ion and a bromide ion. An onium ion is a polyatomic cation compound formed by adding excessive protons (hydrogen cations) to a monoatomic anion. Specific examples thereof include cations such as an imidazolium ion, pyrrolidinium ion, pyridinium ion, piperidinium ion, ammonium ion, phosphonium ion, fluoronium ion, chloronium ion, bromonium ion, iodonium ion, oxonium ion, sulfonium ion, selenonium ion, telluronium ion, arsonium ion, stibonium ion, bismuthonium ion, and the like. In addition, a compound which generates hypobromous acid or a hypobromite ion in the treatment liquid can be suitably used as a bromine-containing compound. Examples of such compounds include, but are not limited to, bromohydantoins, bromoisocyanuric acids, bromosulfamic acids, bromochloramines, and the like. More specific examples of the compounds include 1-bromo-3-chloro-5,5-dimethylhydantoin, 1,3-dibromo-5,5-dimethylhydantoin, tribromoisocyanuric acid, and the like.

The bromine-containing compound may be in the form of hydrogen bromide or bromine salt when being added to the treatment liquid, may be in the form of a solution containing bromine salt when being added to the treatment liquid, or may be in the form of bromine gas when being added to the treatment liquid. To be easily handled in semiconductor production processes, the bromine-containing compound is preferably in the form of bromine salt, a solution containing bromine salt, or hydrogen bromide when being mixed with another treatment liquid. The treatment liquid may contain one kind of bromine-containing compound or a combination of two or more kinds thereof.

In semiconductor production, contamination by metal or a metal ion causes a decrease in the yield rate, and thus, the bromine-containing compound desirably contains no metal. Bromine gases, hydrogen bromide, and onium bromides among bromine salts contain substantially no metal, and thus, can be suitably used as bromine-containing compounds in the present invention. Among onium bromides, a quaternary onium bromide, a tertiary onium bromide, and hydrogen bromide are industrially available and easy to handle, and thus, are more suitable as bromine-containing compounds in the present invention.

A quaternary onium bromide is a bromine salt composed of an ammonium ion or a phosphonium ion which can be stably present in the treatment liquid. Examples of quaternary onium bromides include tetramethylammonium bromide, tetraethylammonium bromide, tetrapropylammonium bromide, tetrabutylammonium bromide, tetrapentylammonium bromide, tetrahexylammonium bromide, methyltriethylammonium bromide, di ethyldimethylammonium bromide, trimethylpropylammonium bromide, butyltrimethylammonium bromide, trimethylnonylammonium bromide, decyltrimethylammonium bromide, tetradecyltrimethylammonium bromide, hexadecyltrimethylammonium bromide, trimethyl stearyl ammonium bromide, decamethonium bromide, phenyltrimethylammonium bromide, benzyltrimethylammonium bromide, dimethylpyrrolidinium bromide, dimethylpiperidinium bromide, 1-butyl-3-methylimidazolium bromide, 1-butyl-3-methylpyridinium bromide, and the like. In addition, a compound in which a proton is added to a tertiary amine, secondary amine, or primary amine can be used as a bromine-containing compound. Examples of bromine-containing compounds include methylamine hydrobromide, dimethylamine hydrobromide, ethylamine hydrobromide, diethylamine hydrobromide, triethylamine hydrobromide, 2-bromoethylamine hydrobromide, 2-bromoethyldiethylamine hydrobromic acid, ethylenediamine dihydrobromide, propylamine hydrobromide, butylamine hydrobromide, tert-butylamine hydrobromide, neopentylamine hydrobromide, 3-bromo-1-propylamine hydrobromide, dodecyl amine hydrobromide, cyclohexaneamine hydrobromide, benzylamine hydrobromide, and the like. Examples of quaternary phosphonium bromides include tetramethylphosphonium bromide, tetraethylphosphonium bromide, tetrapropylphosphonium bromide, tetrabutylphosphonium bromide, tetraphenylphosphonium bromide, methyltriphenylphosphonium bromide, phenyltrimethylphosphonium bromide, methoxycarbonylmethyl(triphenyl)phosphonium bromide, and the like. A tertiary onium bromide is a bromine salt composed of a sulfonium ion which can be stably present in the treatment liquid. Examples of tertiary sulfonium bromides include trimethylsulfonium bromide, triethylsulfonium bromide, tripropylsulfonium bromide, tributylsulfonium bromide, triphenylsulfonium bromide, and (2-carboxyethyl)dimethylsulfonium bromide. Among these, a quaternary onium bromide, which is a bromine salt composed of an ammonium ion, is preferable because a quaternary onium bromide has high stability, is industrially available in the form of a high purity product, and is inexpensive.

The quaternary onium bromide is preferably tetraalkylammonium bromide which has excellent stability in particular and can be easily synthesized.

In the tetraalkylammonium bromide, the carbon number of each alkyl group is not limited to any particular value, and the carbon numbers of the four alkyl groups may be the same or different. Examples of such an alkylammonium bromide which can be suitably used include a tetraalkylammonium bromide having 1 to 20 carbon numbers per alkyl group. Among these, tetraalkylammonium bromide in which the alkyl group has a smaller carbon number can be more suitably used because of having more bromine atoms per weight. Examples thereof include tetramethylammonium bromide, tetraethylammonium bromide, tetrapropylammonium bromide, tetrabutylammonium bromide, tetrapentylammonium bromide, tetrahexylammonium bromide, and the like; tetramethylammonium bromide, tetraethylammonium bromide, tetrapropylammonium bromide, and tetrabutylammonium bromide are suitable; and tetramethylammonium bromide is most suitable. The treatment liquid may contain one or more kinds of bromine-containing compounds.

A tetraalkylammonium bromide to be used in the present invention may be a commercially available tetraalkylammonium bromide, or may be a tetraalkylammonium bromide produced from a tetraalkylammonium ion and a bromide ion. A method of producing a tetraalkylammonium bromide only needs to include mixing an aqueous solution containing tetraalkylammonium hydroxide with an aqueous solution containing a bromide ion or with a bromine-containing gas which is dissolved in water to generate a bromide ion, examples of such a gas including hydrogen bromide.

Examples of the tetraalkylammonium hydroxide to be used to produce tetraalkylammonium bromide include tetramethylammonium hydroxide, tetraethylammonium hydroxide, tetrapropylammonium hydroxide, tetrabutylammonium hydroxide, and the like. Among these, the tetraalkylammonium hydroxide is more preferably tetramethylammonium hydroxide in terms of the large number of hydroxide ions per unit weight and in terms of being easily available in the form of a high purity product.

Examples of bromine ion sources which generate a bromide ion to be used to produce tetraalkylammonium bromide include hydrogen bromide, lithium bromide, sodium bromide, potassium bromide, rubidium bromide, cesium bromide, ammonium bromide, and the like. Among these, hydrogen bromide is suitable in terms of containing substantially no metal, being industrially available, and being easily available in the form of a high purity product.

The addition amount of the bromine-containing compound is not limited to any particular value, and can be determined taking into consideration the etching rate of ruthenium, the stability of the treatment liquid, the solubility of the bromine-containing compound, cost, and the like. The bromine-containing compound added to the treatment liquid is oxidized by the below-mentioned oxidizing agent to become a chemical species effective for etching of ruthenium, specific examples of such a chemical species including bromine ($Br_2$), hypobromous acid (HBrO), a hypobromite ion ($BrO^-$), bromous acid ($HBrO_2$), bromous acid ion ($BrO_2^-$), bromic acid ($HBrO_3$), bromic acid ion ($BrO_3^-$), perbromic acid ($HBrO_4$), perbromic acid ion ($BrO_4^-$), and bromide ion ($Br^-$).

Among the above-mentioned chemical species effective for etching of ruthenium, the treatment liquid containing HBrO, $BrO^-$, $HBrO_2$, $BrO_2^-$, $HBrO_3$, and $BrO_3^-$ allows the etching rate of ruthenium to be high, and thus, the treatment liquid preferably contains these chemical species. Among these, the treatment liquid containing a larger amount of HBrO and $BrO^-$ (hereinafter referred to as $BrO^-$ or the like) allows the etching rate of ruthenium to be particularly high, and thus, is more preferable in terms of being able to shorten the treatment time.

Accordingly, in cases where the bromine-containing compound is oxidized by an oxidizing agent, the bromine atom contained in the bromine-containing compound is preferably oxidized into HBrO, $BrO^-$, $HBrO_2$, $BrO_2^-$, $HBrO_3$, or $BrO_3^-$, and more preferably oxidized into $BrO^-$ or the like among these.

Increasing the proportion of $BrO^-$ or the like contained in the treatment liquid makes it possible to increase the etching rate of ruthenium. Specifically, a treatment liquid in which the proportion of $BrO^-$ in 1 mol of bromine element contained in the treatment liquid is more than 0.5 mol enables ruthenium to be etched efficiently.

In cases where Br is generated by the decomposition of the above-mentioned chemical species effective for etching of ruthenium, in other words, $Br_2$, HBrO, $BrO^-$, $HBrO_2$, $BrO_2^-$, $HBrO_3$, $BrO_3^-$, $HBrO_4$, or $BrO_4^-$, or by the reaction between ruthenium and the chemical species, it is preferable that the treatment liquid contains an oxidizing agent which can oxidize $Br^-$ back into the chemical species effective for etching of ruthenium. Having such an oxidizing agent present in the treatment liquid enables the concentration of the chemical species effective for etching of ruthenium to be kept high and makes it possible to maintain the etching rate of ruthenium. In cases where $BrO^-$ or the like is decomposed by disproportionation, $HBrO_3$ or $BrO_3^-$ and $Br^-$ are generated via $HBrO_2$ or $BrO_2^-$ in some cases. Even in cases where a treatment liquid according to the present invention contains one or more of $HBrO_2$, $BrO_2^-$, $HBrO_3$, $BrO_3^-$, $Br^-$, and the like in addition to $BrO^-$ or the like, the treatment liquid can be suitably used for etching of ruthenium. Also in cases where the treatment liquid contains a plurality of chemical species effective for etching of ruthenium, it is preferable that the treatment liquid contains an oxidizing agent which can oxidize Br back into a chemical species effective for etching of ruthenium.

In addition, in cases where the treatment liquid contains not only $BrO^-$ but also a decomposition product of $BrO^-$ (for example, $HBrO_2$, $BrO_2^-$, $HBrO_3$, $BrO_3^-$, $Br^-$, or the like), a change in the concentration of BrO⁻ in the treatment liquid is moderate, stabilizing the etching rate of ruthenium. Accordingly, a treatment liquid according to the present invention may contain one or more kinds of the above-mentioned decomposition products of BrO⁻. A treatment liquid according to the present invention containing, for example, BrO⁻ or $BrO_3^-$ can be suitably used for etching of ruthenium.

To etch ruthenium efficiently, the proportion of BrO⁻ in 1 mol of bromine element contained in the treatment liquid is preferably more than 0.5 mol.

Both the oxidization of a bromine-containing compound or Br⁻ into a chemical species effective for etching of ruthenium and etching of ruthenium are carried out in an alkaline treatment liquid, which can thus become a treatment liquid in which the proportion of BrO⁻ in 1 mol of bromine element contained in the treatment liquid is more than 0.5 mol. This is because the bromine-containing compound or Br in the alkaline treatment liquid is directly oxidized by an oxidizing agent into BrO⁻ or the like.

A treatment liquid having an alkaline pH makes it possible that the oxidization of Br⁻ by an oxidizing agent and etching ruthenium are carried out repeatedly and continuously. In other words, the following reactions are repeated: (A) a reaction in which an oxidizing agent oxidizes Br⁻ into a chemical species effective for etching of ruthenium; and (B) a reaction in which the chemical species effective for etching of ruthenium etches ruthenium, thus reverting to Br⁻. Owing to this, the proportion of BrO⁻ in 1 mol of bromine element in the treatment liquid is more than 0.5 mol, enabling ruthenium to be etched efficiently.

Furthermore, the reactions (A) and (B) induced repeatedly and continuously result in causing the concentration of BrO⁻ or the like in the treatment liquid to be kept constant, thus stabilizing the etching rate of ruthenium.

The progress of (A) the reaction in which an oxidizing agent oxidizes Br⁻ into a chemical species effective for etching of ruthenium causes the oxidizing agent in the treatment liquid to be consumed. When all the oxidizing agent in the treatment liquid is consumed for the reaction, no more bromine-containing compound or Br⁻ is oxidized. However, a treatment liquid in which the amount of a chemical species effective for etching of ruthenium is large, in other words, a treatment liquid in which the proportion of BrO⁻ in 1 mol of bromine element is more than 0.5 mol does not lose the ruthenium etching capability immediately, and makes it possible that ruthenium is etched until the chemical species effective for etching of ruthenium in the treatment liquid is no more present.

In cases where a bromine-containing compound or Br⁻ is oxidized into a chemical species effective for etching of ruthenium in an acidic treatment liquid, the bromine-containing compound or Br is oxidized by an oxidizing agent to generate bromine gas. The bromine gas absorbed by alkali generates hypobromite and a bromine salt at a molar ratio of 1 to 1. Accordingly, the proportion of BrO⁻ contained in the treatment liquid results in 0.5 mol per mole of bromine element contained in the treatment liquid, and is never more than 0.5. Obviously, in cases where all the amount of the bromine-containing compound or Br contained in the treatment liquid is not oxidized, the proportion of BrO⁻ contained in the treatment liquid results in less than 0.5 per mole of bromine element contained in the treatment liquid.

In cases where the bromine-containing compound or Br⁻ is oxidized into a chemical species effective for etching of ruthenium under acidic conditions and where ruthenium is etched under alkaline conditions, the time for generating bromine gas and the time for adjusting the pH of the treatment liquid are required between the generation of the chemical species effective for etching of ruthenium by the oxidizing agent and the etching of ruthenium, thus causing the ruthenium etching process to be intermittent and markedly lowering the productivity. Because of this, the generation of the chemical species effective for etching of ruthenium by the oxidizing agent under acidic conditions has to be carried out only once before the etching of ruthenium. In this case, the above-mentioned reactions (A) and (B) are not induced repeatedly and continuously, and thus, the proportion of BrO⁻ in 1 mol of bromine element contained in the treatment liquid is 0.5 or less.

Using the treatment liquid for etching of ruthenium causes the chemical species effective for etching of ruthenium to react with ruthenium, causing a decrease only on the part of the species, and thus, the proportion of BrO⁻ in 1 mol of bromine element contained in the treatment liquid is still less than 0.5.

The treatment liquid in which the proportion of BrO⁻ in 1 mol of bromine element contained in the treatment liquid is 0.5 mol or less is significantly lower in the stability of the etching rate of ruthenium, the number of ruthenium films that can be etched, and the life time of the treatment liquid than the treatment liquid in which the proportion of BrO⁻ in 1 mol of bromine element contained in the treatment liquid is more than 0.5 mol. Accordingly, to etch ruthenium stably and efficiently, it is preferable that the treatment liquid is alkaline, and that the proportion of BrO⁻ in 1 mol of bromine element contained in the treatment liquid is more than 0.5 mol.

With respect to the total mass of the treatment liquid, the addition amount of the bromine-containing compound is preferably 0.008 mass % or more and less than 10 mass % as a bromine element content. The amount of less than 0.008 mass % causes ruthenium to be etched at a low rate, and is not very practicable. The amount of 10 mass % or more makes it difficult to control the etching rate of ruthenium in production processes. Accordingly, the addition amount of the bromine-containing compound contained in a treatment liquid according to the present invention is preferably 0.008 mass % or more and less than 10 mass % as a bromine element content in terms of achieving a high etching rate and carrying out an efficient production with the etching rate controlled. In addition, the upper limit of the addition amount of the bromine-containing compound contained in a treatment liquid according to the present invention is more preferably less than 2 mass % as a bromine element content. Less than 2.0 mass % as the addition amount of the bromine-containing compound makes it more unlikely to induce the disproportionation of the chemical species effective for etching of ruthenium, particularly HBrO, BrO⁻, $HBrO_2$, and $BrO_2^-$ and makes it possible to inhibit fluctuations in the concentrations of these chemical species, thus stabilizing the etching rate. Furthermore, less than 2.0 mass % as the addition amount of the bromine-containing compound makes it possible that control of the etching rate of ruthenium causes the concentration of $RuO_4$ gas generated per unit time to be controlled at a low level, and that the generation of $RuO_2$ particles is further decreased.

In addition, the lower limit of the addition amount of the bromine-containing compound contained in a treatment liquid according to the present invention is more preferably 0.01 mass % or more as a bromine element content. The bromine-containing compound in an addition amount of 0.01 mass % or more makes it possible that the chemical species effective for etching of ruthenium is generated efficiently, that the etching rate is still higher, and that the ruthenium is etched efficiently at a stable etching rate. Accordingly, the addition amount of the bromine-containing compound contained in a treatment liquid according to the present invention is still more preferably 0.01 mass % or more and less than 2 mass % as a bromine element content. In addition, the addition amount of the bromine-containing compound is still more preferably 0.04 mass % or more and less than 2.0 mass % as a bromine element content in terms of increasing the throughput and enhancing the production efficiency. Furthermore, the addition amount of the bromine-containing compound is most preferably 0.08 mass % or more and less than 2.0 mass % as a bromine element content in that the etching rate is more stabilized because the oxidizing agent makes it more likely to induce reoxidization into a chemical species effective for etching of ruthenium.

The pH of a solution containing the bromine-containing compound is not limited to any particular value, and is preferably pH 8 or more and 14 or less, more preferably 12 or more and 13 or less. A solution having a pH in these range makes it possible to decrease a pH decrease arising from mixing a solution containing the below-mentioned oxidizing agent and a solution containing the bromine-containing compound, and makes it possible to produce, store, and use a treatment liquid according to the present invention in a stable manner. To cause a solution containing the bromine-containing compound to have a pH of less than 8, the pH and liquid amount of the solution containing the bromine-containing compound can be adjusted so that a treatment liquid obtained after mixing the solution containing the below-mentioned oxidizing agent and the solution containing the bromine-containing compound can have an alkaline pH.

An iodine-containing compound can be used in the same manner as the bromine-containing compound. In this case, iodine contained in the iodine-containing compound can be oxidized by an oxidizing agent contained in the treatment liquid to become a chemical species for etching of ruthenium.

(Oxidizing Agent)

An oxidizing agent to be used for a treatment liquid according to the present invention has a function which can oxidize the bromine-containing compound to generate a chemical species effective for etching of ruthenium. Specific examples thereof include nitric acid, sulfuric acid, persulfuric acid, peroxodisulfuric acid, hypochlorous acid, chlorous acid, chloric acid, perchloric acid, hypobromous acid, bromous acid, bromic acid, perbromic acid, hypoiodous acid, iodous acid, iodic acid, periodic acid, salts thereof, ions generated from dissociation of these salts, hydrogen peroxide, ozone, fluorine, chlorine, bromine, iodine, permanganate, chromate, dichromate, cerium salt, and the like. These oxidizing agents may be used singly or in combination of two or more thereof. In cases where any of these oxidizing agents is added to a treatment liquid according to the present invention, the oxidizing agent can be selected in the form of any suitable one of a solid, liquid, and gas in accordance with the properties of the oxidizing agent to be used.

In terms of being able to be stably present despite of being alkaline, preferable oxidizing agents among these are hypochlorous acid, chlorous acid, chloric acid, perchloric acid, hypobromous acid, bromous acid, bromic acid, perbromic acid, hypoiodous acid, iodous acid, iodic acid, periodic acid, salts thereof, ions generated from dissociation of these salts, ozone, and hydrogen peroxide; more preferable oxidizing agents are hypochlorous acid, chlorous acid, chloric acid, perchloric acid, hypobromous acid, bromous acid, bromic acid, perbromic acid, salts thereof, ions generated from dissociation of these salts, ozone, and hydrogen peroxide; still more preferable oxidizing agents are hypochlorite ions and ozone; and most preferable oxidizing agents are hypochlorite ions.

Using hypochlorous acid, tetraalkylammonium hypochlorite, which is a salt thereof, or ozone as the oxidizing agent makes it possible to substantially prevent contamination by metal, and thus, is suitable for a treatment liquid for semiconductor production. Among these, tetraalkylammonium hypochlorite is stable in alkali, can oxidize the bromine-containing compound efficiently, and thus is particularly suitable.

The oxidizing agent is not limited to any particular concentration, and can be added in an amount which makes it possible to oxidize the bromine-containing compound into a chemical species effective for etching of ruthenium.

The addition amount of the oxidizing agent is preferably 0.1 mass ppm or more and 10 mass % or less. The oxidizing agent the addition amount of which is less than 0.1 mass ppm is unable to oxidize the bromine-containing compound efficiently, resulting in decreasing the etching rate of ruthenium. In other words, a composition in which the oxidizing agent is not mixed causes the etching rate to be low. In addition, the oxidizing agent added in an amount of more than 10 mass % decreases the stability of the oxidizing agent, and thus, is not suitable. The concentration of the oxidizing agent is more preferably 0.1 mass % or more and 10 mass % or less, still more preferably 0.3 mass % or more and 7 mass % or less, most preferably 0.5 mass % or more and 4 mass % or less, in terms of satisfying both the inhibition of $RuO_4$ gas and the etching rate of ruthenium. In this regard, the oxidizing agent which is ozone preferably has a concentration within above mentioned ranges.

The pH of a solution containing the oxidizing agent is not limited to any particular value, and is preferably pH 8 or more and 14 or less, more preferably 12 or more and 13 or less. A solution having a pH in these ranges makes it possible to decrease a pH decrease arising from mixing a solution containing the bromine-containing compound and a solution containing the oxidizing agent, and makes it possible to produce, store, and use a treatment liquid according to the present invention in a stable manner. To cause a solution containing the oxidizing agent to have a pH of less than 8, the pH and liquid amount of the solution containing the oxidizing agent can be adjusted so that a treatment liquid obtained after mixing the solution containing the bromine-containing compound and the solution containing the oxidizing agent can have an alkaline pH.

<Method of Producing Tetraalkylammonium Hypochlorite Solution>

As above-mentioned, an oxidizing agent which may be contained in a treatment liquid according to the present invention is preferably tetraalkylammonium hypochlorite. Accordingly, a preferable aspect of a method of producing tetraalkylammonium hypochlorite will be described below. The method of producing the oxidizing agent includes a preparation step of providing a tetraalkylammonium hydroxide solution and a reaction step of contacting the tetraalkylammonium hydroxide solution with chlorine.

(Preparation Step of Providing Tetraalkylammonium Hydroxide Solution)

A tetraalkylammonium hydroxide solution usually contains carbon dioxide, which is derived from the air. The carbon dioxide is present in the form of carbonate ions or bicarbonate ions in the solution. The concentration of carbon dioxide is not limited to any particular value, and is preferably 0.001 ppm or more and 500 ppm or less (by mass), more preferably 0.005 ppm or more and 300 ppm or less, still more preferably 0.01 ppm or more and 100 ppm or less, in terms of carbonate ions. Causing the tetraalkylammonium hydroxide solution to have a carbon dioxide concentration of 0.001 ppm or more and 500 ppm or less makes it possible to inhibit a change in the pH of the obtained tetraalkylammonium hypochlorite solution. As a result, the storage stability of the tetraalkylammonium hypochlorite solution can be enhanced.

In the present embodiment, the tetraalkylammonium hydroxide solution is preferably a solution of a tetraalkylammonium hydroxide in which the alkyl group has 1 to 10 carbon numbers, more preferably a solution of tetraalkylammonium hydroxide in which the alkyl group has 1 to 5 carbon numbers. Specific examples of tetraalkylammonium hydroxides include tetramethylammonium hydroxide, tetraethylammonium hydroxide, tetrabutylammonium hydroxide, and the like. These tetraalkylammonium hydroxides may be used singly or in combination of two or more kinds thereof. In addition, the carbon numbers of the four alkyl groups contained in the tetraalkylammonium hydroxide may be same or different.

(Reaction Step of Contacting Tetraalkylammonium Hydroxide Solution with Chlorine)

Allowing a tetraalkylammonium hydroxide solution to contact and react with chlorine causes the hydroxide ion of the tetraalkylammonium hydroxide to be replaced with a hypochlorite ion generated by chlorine, thus generating a tetraalkylammonium hypochlorite solution.

In the present embodiment, the upper limit of the concentration of carbon dioxide in the gas phase portion is 100 vol ppm, and the concentration of 0.001 to 100 vol ppm, preferably 0.01 to 80 vol ppm, makes it possible to sufficiently control the pH of the tetraalkylammonium hypochlorite solution and to produce a tetraalkylammonium hypochlorite solution having excellent storage stability.

The range of the pH of the liquid phase portion in the reaction step according to the present embodiment is 10.5 or more. The upper limit is not limited to any particular value, and an excessively high pH during reaction can cause the hypochlorite ion to be decomposed and decrease the effective chlorine concentration during long-time storage carried out at the same pH after completion of the reaction. Accordingly, the pH of the liquid phase portion in the reaction step is preferably less than 14, more preferably less than 13.9, still more preferably 11 or more and less than 13.8. The pH in these ranges allows the decomposition of the hypochlorite ion to be inhibited during the storage of the obtained tetraalkylammonium hypochlorite solution, enhancing the storage stability.

In the present embodiment, the range of the reaction temperature of the tetraalkylammonium hydroxide solution in the reaction step is preferably −35° C. or more and 25° C. or less, more preferably −15° C. or more and 25° C. or less, still more preferably 0° C. or more and 25° C. or less. The reaction temperature in these ranges makes it possible that the tetraalkylammonium hydroxide solution and chlorine react sufficiently to obtain a tetraalkylammonium hypochlorite solution at a high generation efficiency.

As clear from the above description, a tetraalkylammonium hypochlorite solution obtained by the production method according to the present embodiment has excellent storage stability, and thus, can be suitably used as an oxidizing agent to be contained in a treatment liquid according to the present invention.

(Basic Compound)

A basic compound to be used for a treatment liquid according to the present invention is not limited to any particular compound, and examples of basic compounds to be used include lithium hydroxide, sodium hydroxide, potassium hydroxide, rubidium hydroxide, cesium hydroxide, magnesium hydroxide, calcium hydroxide, strontium hydroxide, barium hydroxide, ammonia, choline, alkylammonium hydroxide, and the like. Among these basic compounds, sodium hydroxide, potassium hydroxide, ammonia, choline, and alkylammonium hydroxide are easily available, afford a high ruthenium etching rate when used for the treatment liquid, and are suitable. Ammonia, choline, and alkylammonium hydroxide contain no metal, and thus, can be particularly suitably used for a treatment liquid according to the present invention. Examples of industrially available alkylammonium hydroxides include tetramethylammonium hydroxide, tetraethylammonium hydroxide, tetrapropylammonium hydroxide, tetrabutylammonium hydroxide, and the like, and tetramethylammonium hydroxide is most suitable in terms of being easily available in the form of a high purity product of semiconductor fabrication grade. The basic compound can be added in the form of a solid or an aqueous solution to the treatment liquid.

The concentration of the basic compound is not limited to any particular value as long as the value does not depart from the object of the present invention, and the solution containing the basic compound preferably has a pH in the range of 8 or more and 14 or less, more preferably 12 or more and 13 or less. Allowing the pH of the solution containing the basic compound to be in these pH ranges makes it possible to decrease a pH decrease arising from mixing a solution containing the above-mentioned oxidizing agent and a solution containing the bromine-containing compound, and makes it possible to produce, store, and use a treatment liquid according to the present invention in a stable manner.

(Water)

Water contained in a treatment liquid according to the present invention is preferably water which is made free from metal ions, organic impurities, and particles by any one of distillation, ion exchange, filtration, and various kinds of adsorption treatments, and the water is particularly preferably pure water or ultrapure water. Such water can be obtained by a known method widely utilized for semiconductor production.

(pH)

A treatment liquid according to the present invention preferably has a pH of 8 or more and 14 or less. The treatment liquid having a pH in this range makes it possible to etch ruthenium at a sufficient rate and inhibit the generation of $RuO_4$ gas. The treatment liquid having a pH of less than 8 causes $RuO_2$ particles to be generated markedly and decreases the yield rate of semiconductor elements. In addition, the treatment liquid having a pH of more than 14 causes the above-mentioned oxidizing agent to be decomposed, and thus, will undesirably not allow the bromine-containing compound to be constantly oxidized. This means that the etching rate of ruthenium is not constant, complicates the process control in semiconductor production processes, and thus, needs to be avoided.

The higher the pH of the treatment liquid, the smaller the amount of $RuO_4$ gas generated by the etching of ruthenium. In addition, the higher the pH of the treatment liquid, the lower the etching rate of ruthenium. Thus, the treatment liquid preferably has a pH of 12 or more and 14 or less, more preferably 12 or more and less than 13, in terms of satisfying both the inhibition of $RuO_4$ gas and the etching rate. The treatment liquid having a pH in these ranges enables that chemical species effective for etching of ruthenium which is contained in a treatment liquid according to the present invention to dissolve ruthenium at a sufficient etching rate, and inhibits the generation of $RuO_4$ gas.

The pH for etching of ruthenium metal is preferably 11 or more and 14 or less, more preferably 12 or more and less than 13. The treatment liquid having a pH in these ranges makes it possible that the etching rate and a decrease in the generation amount of $RuO_4$ gas are satisfied in etching of ruthenium metal.

The pH for etching of ruthenium alloy preferably is 12 or more and 14 or less, more preferably 12 or more and less than 13.

(Method of Producing Treatment Liquid)

In cases where a treatment liquid according to the present invention contains a bromine-containing compound, an oxidizing agent, a basic compound, and water, the treatment liquid may be a one-component liquid or a two- or more multi-component solution. In cases where the treatment liquid is a one-component liquid, the liquid is a solution containing all of a bromine-containing compound, an oxidizing agent, a basic compound, and water. In cases where the treatment liquid is a two-component or more multi-component liquid, the treatment liquid may be produced by mixing the liquid components. In cases where the treatment liquid is a two- or more multi-component liquid, each liquid component contains at least one of a bromine-containing compound, an oxidizing agent, a basic compound, and water. The treatment liquid may further contain the below-mentioned other component(s). Whether the treatment liquid is a one-component liquid or a two- or more multi-component liquid, having a bromine-containing compound, an oxidizing agent, and a basic compound coexisting in the treatment liquid causes the bromine-containing compound to be oxidized by the oxidizing agent to generate a chemical species effective for etching of ruthenium.

In cases where a plurality of treatment liquids are used, the liquids are preferably separated into a treatment liquid(s) containing a bromine-containing compound and a treatment liquid(s) containing an oxidizing agent. Separating the bromine-containing compound and the oxidizing agent prevents the bromine-containing compound from being oxidized by the oxidizing agent, and makes it possible to stably store the treatment liquid according to the present invention.

A method which can be used to mix treatment liquids is a method widely known as a method of mixing chemical liquids for semiconductors. Examples of methods which can be suitably used include: a method in which a mixing tank is used; a method in which liquids are mixed in the piping of a semiconductor production apparatus (in-line mixing); a method in which a plurality of liquids are simultaneously sprayed onto a wafer so as to be mixed; and the like.

In cases where a plurality of separated treatment liquids are mixed to produce a treatment liquid, the separated treatment liquids may be mixed any time. In cases where the oxidization of the bromine-containing compound takes some time, mixing the treatment liquids before etching ruthenium makes it possible to provide the time to generate a chemical species effective for etching of ruthenium. In this case, taking time to oxidize the bromine-containing compound results in a bottleneck in production lines, and thus, causes a decrease in throughput in some cases. For this reason, the shorter the time taken by the oxidization, the better, and the time is preferably one hour or less. The time taken by the oxidization of the bromine-containing compound can be controlled by suitably selecting the concentration of the oxidizing agent, the concentration of the bromine-containing compound, the pH of the treatment liquid, the temperature of the treatment liquid, a method of stirring the treatment liquid, and the like. For example, in cases where a hypobromite ion is generated by using an oxidizing agent to oxidize a bromine-containing compound, increasing the concentration of the reactant enables the time taken by the oxidization to be shortened according to reaction kinetics. In this case, the concentrations of both the oxidizing agent and the bromine-containing compound may be increased, or the concentration of only one of them may be increased. Increasing the temperature of the treatment liquid during mixing also enables the time taken by the oxidization of the bromine-containing compound to be shortened.

In addition, a low concentration of the chemical species effective for etching of ruthenium causes the life time of the treatment liquid to be short, and conceivably makes it difficult to control the production processes. In such a case, the mixing is preferably carried out immediately before the ruthenium etching is carried out.

Accordingly, in cases where a plurality of treatment liquids are mixed, it is preferable to mix a solution containing an oxidizing agent and a basic compound and a solution containing a bromine-containing compound, it is more preferable to mix a solution containing a hypochlorite ion and a basic compound and a solution containing a bromine-containing compound. The solution containing a hypochlorite ion and a basic compound is preferably alkaline. For mixing, it is preferable that the bromine-containing compound is added to the solution containing an oxidizing agent and a basic compound. This is because, for example, in cases where the oxidizing agent is an alkali solution containing hypochlorous acid and where the solution containing a bromine-containing compound is an acidic solution, adding the former to the latter gradually causes the hypochlorous acid to be decomposed in the acidic solution and thus, will undesirably generate chlorine gas, which is toxic. The solution containing a basic compound and an oxidizing agent and the solution containing a bromine-containing compound may each be either a solution or an aqueous solution, but, in cases where the solvent is other than water, for example, an organic or inorganic solvent, the solvent will undesirably react with the oxidizing agent, which is thus decomposed. For this reason, the solution is preferably an aqueous solution.

In mixing a treatment liquid according to the present invention, the treatment liquid after mixing preferably has an alkaline pH. Specifically, the treatment liquid preferably has a pH of 8 or more and 14 or less. In cases where the treatment liquid before mixing has a pH of less than 8, the concentration(s) of the basic compound and/or water is/are adjusted so that the treatment liquid (containing a bromine-containing compound, an oxidizing agent, a basic compound, and water) after mixing can have a pH of 8 or more and 14 or less. Causing the pH of the treatment liquid after mixing to be maintained at 8 or more and 14 or less in such a manner allows the oxidizing agent to promptly change the bromine-containing compound to a chemical species effective for etching of ruthenium, thus enabling a ruthenium film to be etched at a stable and sufficient rate.

In cases where a plurality of treatment liquids are mixed to generate a chemical species effective for etching of ruthenium, the treatment liquids to be mixed may have the same or different pH(s). In cases where the treatment liquids have the same pH, the pH of the treatment liquid after mixing does not change significantly, and thus, the treatment liquid can be suitably used as an etching liquid for ruthenium.

In cases where a plurality of treatment liquids are mixed to generate a chemical species effective for etching of ruthenium, the composition (the concentration of the bromine-containing compound, the concentration of the oxidizing agent, the concentration of the basic compound, and the pH) after mixing only needs to be within the above-mentioned ranges, and a mixing method including a mixing ratio, a mixing order, and the like for the treatment liquids to be mixed is not limited to any particular method. For example, however, in cases where an alkali solution containing a hypochlorous acid compound and an acidic solution containing a bromine-containing compound are mixed, local decomposition of the hypochlorous acid compound will undesirably be promoted, and thus, in this case, it is preferable that the acidic solution containing a bromine-containing compound is added to and mixed with the alkali solution containing a hypochlorous acid compound.

In the present invention, a hypochlorous acid compound refers to a compound which generates a hypochlorous acid or a hypochlorite ion in the treatment liquid. Examples of the hypochlorous acid compounds include hypochlorous acid, hypochlorite, hydantoins, isocyanuric acids, sulfamic acids, chloramines, and the like. Among these, hypochlorous acid and hypochlorite are preferable because these can generate hypochlorous acid or a hypochlorite ion efficiently. The hypochlorous acid is preferably tetraalkylammonium hypochlorite, and is more preferably tetramethylammonium hypochlorite in particular because this contains hypochlorous acid or a hypochlorite ion in a large amount per unit weight.

Those chemical species effective for etching of ruthenium which are generated by causing a bromine-containing compound to be oxidized by an oxidizing agent vary depending on the pH, oxidation-reduction potential (ORP), and the like of the treatment liquid, and are mainly bromine, a bromide ion, hypobromous acid, bromous acid, bromic acid, perbromic acid, and ions thereof.

In addition, a treatment liquid according to the present invention preferably contains metal, specifically, sodium, potassium, aluminum, magnesium, iron, nickel, copper, silver, cadmium, and lead, each in an amount of 1 ppb or less.

A treatment liquid according to the present invention and the bromine-containing compound, an oxidizing agent, a basic compound, water, solvent, and the other additives used for the treatment liquid preferably contain smaller amounts of ammonia and amines. This is because ammonia and amines present in the treatment liquid react with the oxidizing agent, the bromine-containing compound, those chemical species effective for etching of ruthenium which are generated from the bromine-containing compound, and the like decrease the stability of the treatment liquid. For example, in cases where tetramethylammonium hydroxide is used as a basic compound, ammonia and amines, particularly trimethyl amine, contained in the basic compound cause the stability of the treatment liquid to decrease in some cases. Because of this, in cases where tetramethylammonium hydroxide is used for a treatment liquid according to the present invention, the total amount of amines contained in the basic compound is preferably 100 ppm or less. The amines in a total amount of 100 ppm or less have a minor influence caused by reaction with the oxidizing agent, the bromine-containing compound, and those chemical species effective for etching of ruthenium which are generated from the bromine-containing compound, and such amines do not impair the stability of the treatment liquid.

A treatment liquid according to the present invention is preferably produced under light-shielding to prevent light from decomposing the oxidizing agent, those chemical species effective for etching of ruthenium which are generated form the bromine-containing compound, and the like.

In the production of a treatment liquid according to the present invention, it is also preferable to prevent carbon dioxide from dissolving into the treatment liquid. In cases where a treatment liquid according to the present invention is alkaline, carbon dioxide easily dissolves into the treatment liquid, and can cause a change in the pH. A change in the pH of the treatment liquid not only constitutes a factor for varying the etching rate of ruthenium but also decreases the stability the treatment liquid. The dissolution of carbon dioxide into the treatment liquid can be decreased by a method, for example, passing an inert gas flow through a production apparatus to purge carbon dioxide therefrom, causing a reaction under an inert gas atmosphere, and the like. Having 100 ppm or less carbon dioxide in the production apparatus enables the influence caused by the dissolution of carbon dioxide to be negligible.

In the production of a treatment liquid according to the present invention, that face of a reaction container which is in contact with the treatment liquid is preferably formed of glass or an organic polymer material. This is because the reaction container having the inner face formed of glass or an organic polymer material makes it possible to further decrease contamination by impurities such as metal, metal oxide, organic substances, and the like. Examples of organic polymer materials which can be used for the inner face of the reaction container include vinyl chloride resins (soft and hard vinyl chloride resins), nylon resins, silicone resins, polyolefin resins (polyethylene and polypropylene), fluorine resins, and the like. Among these, fluorine resins are preferable, considering the easiness of molding, solvent resistance, less elution of impurities, and the like. The fluorine resin is not limited to any particular material provided that the resin is a resin (polymer) containing a fluorine atom, and, as this resin, a known fluorine resin can be used. Examples thereof include polytetrafluoroethylene, polychlorotrifluoroethylene, polyvinylidene fluoride, tetrafluoroethylene-hexafluoropropylene copolymers, tetrafluoroethylene-perfluoroalkylvinylether copolymers, tetrafluoroethylene-ethylene copolymers, chlorotrifluoroethylene-ethylene copolymers, cyclized polymers of perfluoro(butenylvinylether), and the like.

(Other Additives)

If desired, another additive to be conventionally used for a treatment liquid for a semiconductor may be blended with a treatment liquid according to the present invention to the extent that such blending does not impair the object of the present invention. Examples of other additives which can be added include acids, metal corrosion prevention agents, water-soluble organic solvents, fluorine compounds, oxidizing agents, reducing agents, complexing agents, chelators, surfactants, defoaming agents, pH adjustors, stabilizers, and the like. These additives may be added singly or in combination of two or more thereof.

A treatment liquid according to the present invention may contain an alkali metal ion, an alkaline earth metal ion, and the like which are derived from these additives or which are to be added for the convenience in the production of the treatment liquid. For example, the treatment liquid may contain a sodium ion, potassium ion, calcium ion, or the like. If remaining on a semiconductor wafer, however, such an alkali metal ion, alkaline earth metal ion, or the like has an adverse effect (an adverse effect such as a decrease in the yield rate of semiconductor wafers) on a semiconductor element; and thus, the less the amount of such an ion or the like, the more preferable; and in reality, the nearer zero without limit the amount, the more preferable. Because of this, it is preferable that, for example, the pH adjustor is neither an alkali metal hydroxide such as sodium hydroxide or an alkaline earth metal hydroxide but an organic alkali such as ammonia, amine, choline, or tetraalkylammonium hydroxide.

Specifically, the total amount of an alkali metal ion and an alkaline earth metal ion is preferably 1 mass % or less, more preferably 0.7 mass % or less, still more preferably 0.3 mass % or less, particularly preferably 10 ppm or less, most preferably 500 ppb or less.

A treatment liquid according to the present invention may further contain an organic solvent. A treatment liquid according to the present invention containing an organic solvent makes it possible to inhibit the generation of $RuO_4$ gas. The organic solvent to be used may be any solvent provided that the solvent does not impair the function of a treatment liquid according to the present invention. Examples of organic solvents include, but are obviously not limited to, sulfolane, acetonitrile, carbon tetrachloride, 1,4-dioxane, and the like.

A temperature at which ruthenium is etched with a treatment liquid according to the present invention is not limited to any particular value, and can be determined taking into consideration the etching rate of ruthenium, the stability of the treatment liquid, the generation amount of $RuO_4$ gas, and the like. The higher the treatment temperature, the more the generation amount of $RuO_4$ gas; and thus, the lower the treatment temperature, the more preferable. In addition, the higher the temperature, the higher the etching rate of ruthenium. A temperature at which ruthenium is etched is preferably 10° C. to 90° C., more preferably 15° C. to 70° C., most preferably 20° C. to 60° C., in terms of satisfying both the inhibition of $RuO_4$ gas and the etching rate of ruthenium.

A period of treatment time for which ruthenium is etched with a treatment liquid according to the present invention is in the range of from 0.1 to 120 minutes, preferably 0.3 to 60 minutes, and can be suitably selected in accordance with the etching conditions and the semiconductor element to be used. An organic solvent such as alcohol can be used as a rinsing liquid after a treatment liquid according to the present invention is used, and using deionized water alone for rinsing is sufficient.

Use of a treatment liquid according to the present invention makes it possible to inhibit the generation of $RuO_4$ gas and remove, at a sufficient etching rate (10 Å/min or more), ruthenium sticking to the end face portion and back face portion of a semiconductor wafer. In cases where an etching rate of 10 Å/min or more is needed, the concentration of the hypobromite ion contained in the treatment liquid, the concentration of the hypochlorite ion contained therein, the concentration of the bromine-containing compound contained therein, the concentration of the oxidizing agent contained therein, the pH of the treatment liquid, the treatment temperature, a method of contacting the treatment liquid with a wafer, and the like can be suitably selected.

After the above-mentioned treatment liquid according to the present invention is produced, the treatment liquid can be used to etch a ruthenium metal film and/or ruthenium alloy film deposited on a substrate.

(Storage of Treatment Liquid)

A treatment liquid according to the present invention is preferably stored at low temperature and/or under light-shielding. Storage at low temperature and/or under light-shielding can be hopefully expected to have an effect which inhibits the decomposition of an oxidizing agent, hypobromite ion, and the like in the treatment liquid. Furthermore, storing the treatment liquid in a container filled with inert gas and thus preventing contamination by carbon dioxide enables the stability of the treatment liquid to be maintained. In addition, the inner face of the container, in other words, the face in contact with the treatment liquid is preferably formed of glass or an organic polymer material. This is because the reaction container having the inner face formed of glass or an organic polymer material makes it possible to further decrease contamination by impurities such as metal, metal oxide, organic substances, and the like. Examples of organic polymer materials which can be suitably used for the inner face of the reaction container include materials exemplified with reference to the production of a treatment liquid according to the present invention. In addition, the pH of the treatment liquid during storage can be suitably selected, and to prevent the decomposition of the hypobromite ion, the bromine-containing compound, the oxidizing agent, the other additive(s), and the like, the pH of the treatment liquid is preferably alkaline, more preferably 8 or more and 14 or less, most preferably 12 or more and 14 or less.

EXAMPLE

Below, the present invention will be described more specifically with reference to Examples, but the present invention is not limited to these Examples.

(Method of Measuring pH)

The pH of 10 mL of treatment liquid prepared in each of Examples and Comparative Examples was measured using a tabletop pH meter (LAQUA F-73; manufactured by Horiba, Ltd.). The pH was measured after each treatment liquid was prepared and stabilized at 25° C.

(Formation of Ruthenium Film and Amount of Change in Film Thickness)

A ruthenium film used in each of Examples and Comparative Examples was formed as below-mentioned. An oxide film was formed on a silicon wafer using a batch type thermal oxidization furnace, and a ruthenium film, 1200 Å (±10%), was formed on the oxide film by sputtering. A four-probe resistivity meter (Loresta-GP;

manufactured by Mitsubishi Chemical Analytech Co., Ltd.) was used to measure the sheet resistance, and the measurement was converted to a film thickness, which was regarded as the thickness of the ruthenium film before etching treatment. After the etching treatment, the four-probe resistivity meter was used to measure the sheet resistance in the same manner, and the measurement was converted to a film thickness, which was regarded as the thickness of the ruthenium film after etching treatment. A difference between the ruthenium film thickness after etching treatment and the ruthenium film thickness before etching treatment was regarded as the amount of change in film thickness between before and after etching treatment.

(Formation of Ruthenium Dioxide Film and Amount of Change in Film Thickness)

A ruthenium dioxide film used in each of Examples was formed as below-mentioned. An oxide film was formed on a silicon wafer using the batch type thermal oxidization furnace, and a ruthenium dioxide film, 1000 Å (±10%), was formed on the oxide film by sputtering. The four-probe resistivity meter (Loresta-GP; manufactured by Mitsubishi Chemical Analytech Co., Ltd.) was used to measure the sheet resistance, and the measurement was converted to a film thickness, which was regarded as the thickness of the ruthenium dioxide film before etching treatment. After the etching treatment, the four-probe resistivity meter was used to measure the sheet resistance in the same manner, and the measurement was converted to a film thickness, which was regarded as the thickness of the ruthenium dioxide film after etching treatment. A difference between the ruthenium dioxide film thickness after etching treatment and the ruthenium dioxide film thickness before etching treatment was regarded as the amount of change in film thickness between before and after etching treatment.
(Method of Calculating Etching Rate of Ruthenium or Ruthenium Dioxide)

The treatment liquid in each of Examples and Comparative Examples was provided in amount of 60 mL in a fluorine resin-made container with a lid (a PFA container, 94.0 mL; manufactured by As One Corporation). Etching treatment of ruthenium or ruthenium dioxide was carried out by immersing each sample piece, 10×20 mm, in the treatment liquid at 25° C. for one minute.

In addition, 60 mL of the treatment liquid was provided in a fluorine resin-made container with a lid; the container was immersed for one hour in a water bath (Isotemp water bath with a general-purpose hood; manufactured by Thermo Fisher Scientific Inc.) heated to 60° C.; and the treatment liquid temperature was kept at 60° C. The etching treatment of ruthenium or ruthenium dioxide was carried out by immersing each sample piece, 10×20 mm, in the treatment liquid at 60° C. for one minute.

A value was calculated as an etching rate by dividing the amount of change in film thickness between before and after etching treatment by the immersion time, and evaluated as an etching rate in the present invention. The treatment temperatures and treatment times are listed in Table 5. A film which exhibited less than 5 Angstrom as the amount of change in film thickness between before and after treatment was regarded as unetched.
(Quantitative Analysis of $RuO_4$ Gas)

The generation amount of $RuO_4$ gas was measured by ICP-OES. Into a hermetically sealed container, 5 mL of the treatment liquid was added, and one Si wafer, 10×20 mm, on which a ruthenium film having a thickness of 1200 Å was formed was immersed in the liquid at 25° C. or 60° C. until all ruthenium was dissolved. Then, an air flow was passed through the hermetically sealed container, and the gas phase in the hermetically sealed container was sparged into the absorbing liquid (1 mol/L, NaOH) in a container to cause the $RuO_4$ gas generated during the immersion to be trapped in the absorbing liquid. The amount of ruthenium in this absorbing liquid was measured by ICP-OES to determine the amount of Ru in the generated $RuO_4$ gas. Whether all ruthenium on the Si wafer immersed in the treatment liquid was dissolved was verified by using the four-probe resistivity meter (Loresta-GP; manufactured by Mitsubishi Chemical Analytech Co., Ltd.) to measure the sheet resistances before and after immersion, which were converted to film thicknesses. A value obtained by dividing the weight of Ru contained in the $RuO_4$ gas-absorbed liquid by the area of the wafer with Ru was used to evaluate the generation amount of $RuO_4$ gas. The $RuO_4$ gas generation amount of 40 μg/cm² or less was regarded as meaning that the generation of $RuO_4$ gas was inhibited.

Table 1 to Table 4 show the compositions of the treatment liquids, Table 5 shows the evaluation results, Table 6 shows the preparation conditions of the treatment liquids, Table 7 shows the production conditions of the oxidizing agents, Table 8 shows the oxidation-reduction potentials (calculated values) of the hypochlorite ion ($ClO^-$)/$Cl^-$ systems and the hypobromite ion ($BrO^-$)/$Br^-$ systems at 25° C., and Table 9 shows the preparation conditions of the aqueous tetramethylammonium bromide solution.
(Method of Calculating Concentrations of Hypobromite Ion and Hypochlorite Ion)

The concentrations of a hypobromite ion and a hypochlorite ion were measured using an ultraviolet and visible spectrophotometer (UV-2600; manufactured by Shimadzu Corporation). An aqueous solution of a hypobromite ion and a hypochlorite ion each having a known concentration was used to prepare a calibration curve to determine the concentrations of the hypobromite ion and the hypochlorite ion in the produced treatment liquid. The concentration of the hypobromite ion was determined from the measurement data obtained when the absorption spectrum was stabilized after the bromine-containing compound, the oxidizing agent, and the basic compound were mixed.

Example 1

(Preparation of Sample for Etching)
The method described in (Formation of ruthenium film and amount of change in film thickness) was used to form a ruthenium film, and a sample piece cut to 10×20 mm was used for evaluation.
(Production of Oxidizing Agent)

In a 2-L glass three-neck flask (manufactured by Cosmos Bead Co., Ltd.), 209 g of aqueous 25 mass % tetramethylammonium hydroxide solution and 791 g of ultrapure water were mixed to obtain an aqueous 5.2 mass % tetramethylammonium hydroxide solution containing $CO_2$ in an amount of 0.5 ppm. This solution had a pH of 13.8.

Then, a stirring bar (30 mm in full length×8 mm in diameter; manufactured by As One Corporation) was put in the three-neck flask; through one opening, a thermometer protecting tube (a bottom-sealed type; manufactured by Cosmos Bead Co., Ltd.) and a thermometer were inserted; through another opening, a tip of a PFA-made tube (F-8011-02; manufactured by Flon Industry Co., Ltd.) was immersed in the bottom of the solution, wherein the tube was connected to a chlorine gas cylinder and a nitrogen gas cylinder so as to be freely switchable between chlorine gas and nitrogen gas; and the other opening was connected to a gas washing bottle (a gas washing bottle, Model Number 2450/500; manufactured by As One Corporation) filled with an aqueous 5 mass % sodium hydroxide solution. Then, a flow of nitrogen gas having a carbon dioxide concentration of less than 1 ppm was passed through the PFA-mad tube at 0.289 Pa·m³/second (as converted at 0° C.) for 20 minutes to purge carbon dioxide from the gas phase portion. When this took place, the carbon dioxide concentration of the gas phase portion was 1 ppm or less.

Then, a magnetic stirrer (C-MAG HS10; manufactured by As One Corporation) was placed in the lower portion of the three-neck flask, and rotated at 300 rpm for stirring; chlorine gas (having a specified purity of 99.4%; manufactured by Fujiox Co., Ltd.) was supplied at 0.059 Pa·m³/second (as converted at 0° C.) for 180 minutes while the periphery of the three-neck flask was cooled with ice water; and a solution mixture of an aqueous tetramethylammonium hypochlorite solution (an oxidizing agent; corresponding to 3.51 mass %, 0.28 mol/L) and tetramethylammonium hydroxide (corresponding to 0.09 mass %, 0.0097 mol/L)

was thus obtained. When this took place, the liquid temperature during the reaction was 11° C.

(Production of Treatment Liquid)

To 99.21 g of that solution mixture of an aqueous tetramethylammonium hypochlorite solution and tetramethylammonium hydroxide which was obtained by the above-mentioned operation, 0.79 g of 97 mass % tetramethylammonium bromide (manufactured by Tokyo Chemical Industry Co., Ltd.) (corresponding to 0.77 mass %, 0.05 mol/L; 0.40 mass % as a bromine element content) was added to obtain 100 g of treatment liquid as per each of the compositions listed in Table 1 to Table 4. Here, water listed in Table 3 refers to water containing tetramethylammonium chloride in cases where the oxidizing agent is tetramethylammonium hypochlorite.

(Evaluation)

Immediately after the treatment liquid was produced, the pH of the treatment liquid, the etching rate of ruthenium, the generation amount of $RuO_4$ gas, and the concentration of a hypobromite ion were evaluated. The etching rate of ruthenium was evaluated in accordance with the above-mentioned "Method of calculating etching rate of ruthenium". The generation amount of $RuO_4$ gas was evaluated in accordance with the above-mentioned "Quantitative analysis of $RuO_4$ gas". The concentration of the hypobromite ion was evaluated in accordance with the above-mentioned "Method of calculating concentration of hypobromite ion". The stability of the etching rate was evaluated as below-mentioned. The etching rate of the produced treatment liquid was evaluated every ten hours in accordance with the above-mentioned "Method of calculating etching rate of ruthenium". A period of time during which an increase/decrease between the obtained etching rate and the etching rate exhibited immediately after the production was within ±20% was defined as the stability time of the etching rate.

Examples 2 to 23 and Comparative Examples 1 to 3

The treatment liquid in each of Examples 2 to 23 and Comparative Examples 1 to 3 was prepared in the same manner as in Example 1 so that the concentration of the bromine-containing compound, the concentration of the oxidizing agent, the concentration of the basic compound, and the pH could be as per each of the compositions listed in Table 1 to Table 4, and a ruthenium film (sample piece) provided in the same manner as in Example 1 was used for evaluation. In Comparative Examples 1 and 2, the amount of change in film thickness between before and after treatment was less than 5 Angstrom, and the Ru was regarded as unetched. Because of this, the $RuO_4$ gas was not evaluated. In each of Examples 19 and 22 in which hydrobromic acid (acidic) used as a bromine-containing compound was mixed with an aqueous solution (alkaline) containing an oxidizing agent and a basic compound to prepare an aqueous solution (alkaline) containing a hypobromite ion, followed by etching of ruthenium, it was possible to verify, in the same manner as in the other Examples, that the etching rate of ruthenium was high, that the stability of the etching rate was excellent, and that the $RuO_4$ gas inhibition effect was high.

Example 24

(Preparation of Solution Containing Oxidizing Agent and Basic Compound)

A method of producing an oxidizing agent as described in Example 1 was used to prepare a solution (A liquid) containing an oxidizing agent and a basic compound so that the concentration of the oxidizing agent, the concentration of the basic compound, and the pH could be as per each of the compositions listed in Table 6.

(Preparation of Solution Containing Bromine-Containing Compound)

Tetramethylammonium bromide (manufactured by Tokyo Chemical Industry Co., Ltd.) (97 mass %) in an amount of 3.97 g (corresponding to 3.85 mass %, 0.25 mol/L), an aqueous tetramethylammonium hydroxide solution (25 mass %) in an amount of 0.354 g, and ultrapure water in an amount of 95.6 g were mixed to prepare a solution (B liquid) containing a bromine-containing compound so as to be as per each of the compositions listed in Table 6.

(Production of Treatment Liquid)

To 80 g of the A liquid obtained by the above-mentioned operation, 20 g of the B liquid was added to obtain 100 g of treatment liquid as per each of the compositions listed in Table 1 to Table 4.

(Evaluation)

The obtained treatment liquids were evaluated in the same manner as in Example 1.

Examples 25 to 30

In each of Examples 25 to 30, a treatment liquid was prepared in the same manner as in Example 24 in accordance with the composition, mixing ratio, and mixing method listed in Table 6 so that the concentration of the bromine-containing compound, the concentration of the oxidizing agent, the concentration of the basic compound, and the pH could be as per each of the compositions in Table 1 to Table 4; and the treatment liquid was evaluated. The reaction time in Table 6 means the time taken until the etching rate was stabilized after the A liquid and the B liquid were mixed, in other words, the time taken until the concentration of the hypobromite ion ($BrO^-$) was stabilized, or the time taken until a change in the concentration of the hypobromite ion fell within ±5% as the concentration was measured every one minute.

Example 31

(Production of Treatment Liquid)

To 94.43 g of ultrapure water, 1.14 g of orthoperiodic acid (manufactured by Fujifilm Wako Pure Chemical Corporation) (corresponding to 1.14 mass %, 0.05 mol/L) and 0.79 g of tetramethylammonium bromide (manufactured by Tokyo Chemical Industry Co., Ltd., 97 mass %) (corresponding to 0.77 mass %, 0.05 mol/L) were added; the resulting mixture was left to stand for three hours; to the mixture, an aqueous 25 mass % tetramethylammonium hydroxide solution was added until the pH of the resulting mixture became 11; and 100 g of treatment liquid as per each of the compositions listed in Table 1 to Table 4 was thus obtained.

(Evaluation)

The obtained treatment liquids were evaluated in the same manner as in Example 1.

Example 32

(Production of Treatment Liquid)

To 78.21 g of ultrapure water, 0.79 g of tetramethylammonium bromide (manufactured by Tokyo Chemical Industry Co., Ltd., 97 mass %) (corresponding to 0.77 mass %, 0.05 mol/L) and 16.0 g of aqueous 25 mass % tetramethylammonium hydroxide solution were added, followed by adding 5.0 g of orthoperiodic acid (manufactured by Fujifilm Wako Pure Chemical Corporation) (corresponding to 5.0 mass %, 0.22 mol/L), to obtain 100 g of treatment liquid as per each of the compositions listed in Table 1 to Table 4.
(Evaluation)

The obtained treatment liquids were evaluated in the same manner as in Example 1.

Examples 33 to 35

In each of Examples 33 to 35, an oxidizing agent was produced in the same manner as in Example 1 under the conditions listed in Table 7, and a treatment liquid was prepared in the same manner as in Example 1 so that the concentration of the bromine-containing compound, the concentration of the oxidizing agent, the concentration of the basic compound, and the pH could be as per each of the compositions listed in Table 1 to Table 4. The treatment liquids were evaluated in the same manner as in Example 1.

Example 36

(Production of Tetramethylammonium Bromide)

Ultrapure water in an amount of 90.88 g was added to an aqueous 25% tetramethylammonium hydroxide solution (manufactured by Fujifilm Wako Pure Chemical Corporation) in an amount of 9.12 g to prepare an aqueous 2.28% tetramethylammonium hydroxide solution. Then, 95.7 g of ultrapure water was added to 4.3 g of 47% hydrobromic acid (manufactured by Tokyo Chemical Industry Co., Ltd.) to prepare 2.02% hydrobromic acid. An aqueous 2.28% tetramethylammonium hydroxide solution in an amount of 50 g and 2.02% hydrobromic acid in an amount of 50 g were mixed to obtain 100 g of aqueous tetramethylammonium bromide solution listed in Table 9.
(Production of Treatment Liquid)

To 80 g of that solution mixture of an aqueous tetramethylammonium hypochlorite solution and tetramethylammonium hydroxide which was obtained in the same manner as in Example 1, 20 g of aqueous 3.85% tetramethylammonium bromide solution was added to obtain 100 g of treatment liquid as per each of the compositions listed in Table 1 to Table 4.
(Evaluation)

The obtained treatment liquids were evaluated in the same manner as in Example 1.

Example 37

A treatment liquid as per each of the compositions listed in Table 1 to Table 4 was obtained in the same manner as in Example 3. Immediately after the treatment liquid was produced, the pH of the treatment liquid, the etching rate of ruthenium dioxide, the generation amount of $RuO_4$ gas, and the concentration of a hypobromite ion were evaluated. The etching rate of ruthenium dioxide was evaluated in accordance with the above-mentioned "Method of calculating etching rate of ruthenium dioxide". The generation amount of $RuO_4$ gas was evaluated in accordance with the above-mentioned "Quantitative analysis of $RuO_4$ gas". The concentration of the hypobromite ion was evaluated in accordance with the above-mentioned "Method of calculating concentration of hypobromite ion". The stability of the etching rate was evaluated as below-mentioned. The etching rate of the produced treatment liquid was evaluated every ten hours in accordance with the above-mentioned "Method of calculating etching rate of ruthenium dioxide". A period of time during which an increase/decrease between the obtained etching rate and the etching rate exhibited immediately after the production was within +20% was defined as the stability time of the etching rate.

Example 38

A treatment liquid having a pH of 12, containing 0.075 g (0.05 mol/L) of bromic acid sodium (manufactured by Fujifilm Wako Pure Chemical Corporation), and containing the bromine-containing compound, the oxidizing agent, and the basic compound each having the same concentration as in Example 1 as listed in Table 1, was prepared. The obtained treatment liquids were evaluated in the same manner as in Example 1.

Example 39

A treatment liquid having a pH of 12, containing 0.075 g (0.05 mol/L) of bromic acid sodium (manufactured by Fujifilm Wako Pure Chemical Corporation), and containing the bromine-containing compound, the oxidizing agent, and the basic compound each having the same concentration as in Example 10 as listed in Table 1, was prepared. The obtained treatment liquids were evaluated in the same manner as in Example 1.

The compositions and evaluation results of the treatment liquids are listed in Table 1 to Table 5. As shown in Table 5, ruthenium was not etched at all in Comparative Examples 1 and 2, and in Comparative Example 3, in which etching was possible, the etching rate and stability were low, and the generation amount of $RuO_4$ gas was twice higher than the allowable value, making it possible to satisfy none of the etching rate, stability, and $RuO_4$ gas inhibition effect. In contrast, any of the treatment liquids in Examples affords a fast etching rate of ruthenium, excellent etching rate stability, and a high $RuO_4$ gas inhibition effect, thus verifying that the treatment liquids satisfy the above-mentioned three kinds of capability. As the results of Examples 24 to 30, these treatment liquids have verified that the time taken until the etching rate is stabilized is within one hour, that is, sufficiently short. Example 37 provided a treatment liquid having the same concentration of hypobromite ion and the same pH as in Example 3, but made it possible to verify that the treatment liquid had a high etching capability also for ruthenium dioxide. In each of Examples 38 and 39, the treatment liquid had $BrO^-$, $BrO_3^-$, and $Br^-$ present therein, thus resulting in enhancing the stability of the etching rate.

TABLE 1

|  | Bromine-containing compound | Oxidizing agent | Basic compound |
| --- | --- | --- | --- |
| Example 1 | Tetramethylammonium bromide (0.77 mass %, 0.05 mol/L) | Tetramethylammonium hypochlorite (3.51 mass %, 0.28 mol/L) | Tetramethylammonium hydroxide (0.09 mass %, 0.0097 mol/L) |
| Example 2 | Tetramethylammonium bromide (0.15 mass %, 0.01 mol/L) | Tetramethylammonium hypochlorite (3.51 mass %, 0.28 mol/L) | Tetramethylammonium hydroxide (0.09 mass %, 0.0097 mol/L) |

TABLE 1-continued

|  | Bromine-containing compound | Oxidizing agent | Basic compound |
|---|---|---|---|
| Example 3 | Tetramethylammonium bromide (1.54 mass %, 0.1 mol/L) | Tetramethylammonium hypochlorite (3.51 mass %, 0.28 mol/L) | Tetramethylammonium hydroxide (0.09 mass %, 0.0097 mol/L) |
| Example 4 | Tetramethylammonium bromide (0.77 mass %, 0.05 mol/L) | Tetramethylammonium hypochlorite (1.25 mass %, 0.1 mol/L) | Tetramethylammonium hydroxide (0.09 mass %, 0.0097 mol/L) |
| Example 5 | Tetramethylammonium bromide (0.77 mass %, 0.05 mol/L) | Tetramethylammonium hypochlorite (3.51 mass %, 0.28 mol/L) | Tetramethylammonium hydroxide (0.91 mass %, 0.0997 mol/L) |
| Example 6 | Tetramethylammonium bromide (0.77 mass %, 0.05 mol/L) | Tetramethylammonium hypochlorite (3.51 mass %, 0.28 mol/L) | Tetramethylammonium hydroxide (0.03 mass %, 0.0028 mol/L) |
| Example 7 | Tetramethylammonium bromide (0.77 mass %, 0.05 mol/L) | Tetramethylammonium hypochlorite (3.51 mass %, 0.28 mol/L) | Tetramethylammonium hydroxide (0.01 mass %, 0.00068 mol/L) |
| Example 8 | Tetrapropylammonium bromide (2.66 mass %, 0.1 mol/L) | Tetramethylammonium hypochlorite (3.51 mass %, 0.28 mol/L) | Tetramethylammonium hydroxide (0.09 mass %, 0.0097 mol/L) |
| Example 9 | Tetrapropylammonium bromide (0.27 mass %, 0.01 mol/L) | Tetramethylammonium hypochlorite (3.51 mass %, 0.28 mol/L) | Tetramethylammonium hydroxide (0.09 mass %, 0.0097 mol/L) |
| Example 10 | Tetramethylammonium bromide (4.62 mass %, 0.3 mol/L) | Tetramethylammonium hypochlorite (3.51 mass %, 0.28 mol/L) | Tetramethylammonium hydroxide (0.09 mass %, 0.0097 mol/L) |
| Example 11 | Tetramethylammonium bromide (7.7 mass %, 0.5 mol/L) | Tetramethylammonium hypochlorite (3.51 mass %, 0.28 mol/L) | Tetramethylammonium hydroxide (0.09 mass %, 0.0097 mol/L) |
| Example 12 | Tetramethylammonium bromide (0.77 mass %, 0.05 mol/L) | Tetramethylammonium hypochlorite (3.51 mass %, 0.28 mol/L) | Tetramethylammonium hydroxide (0.27 mass %, 0.03 mol/L) |
| Example 13 | Tetramethylammonium bromide (1.23 mass %, 0.08 mol/L) | Tetramethylammonium hypochlorite (1.13 mass %, 0.09 mol/L) | Tetramethylammonium hydroxide (0.63 mass %, 0.06 mol/L) |
| Example 14 | Tetramethylammonium bromide (0.10 mass %, 0.006 mol/L) | Tetramethylammonium hypochlorite (3.51 mass %, 0.28 mol/L) | Tetramethylammonium hydroxide (0.09 mass %, 0.0097 mol/L) |
| Example 15 | Tetramethylammonium bromide (0.39 mass %, 0.025 mol/L) | Tetramethylammonium hypochlorite (3.51 mass %, 0.28 mol/L) | Tetramethylammonium hydroxide (0.09 mass %, 0.0097 mol/L) |
| Example 16 | Tetramethylammonium bromide (2.70 mass %, 0.18 mol/L) | Tetramethylammonium hypochlorite (3.51 mass %, 0.28 mol/L) | Tetramethylammonium hydroxide (0.09 mass %, 0.0097 mol/L) |
| Example 17 | Tetramethylammonium bromide (0.77 mass %, 0.05 mol/L) | Tetramethylammonium hypochlorite (0.13 mass %, 0.01 mol/L) | Tetramethylammonium hydroxide (0.09 mass %, 0.0097 mol/L) |
| Example 18 | Tetramethylammonium bromide (0.77 mass %, 0.05 mol/L) | Tetramethylammonium hypochlorite (3.51 mass %, 0.28 mol/L) | Tetramethylammonium hydroxide (2.87 mass %, 0.32 mol/L) |
| Example 19 | Hydrogen bromide (0.4 mass %, 0.05 mol/L) | Tetramethylammonium hypochlorite (3.51 mass %, 0.28 mol/L) | Tetramethylammonium hydroxide (0.73 mass %, 0.08 mol/L) |
| Example 20 | Tetramethylammonium bromide (0.15 mass %, 0.01 mol/L) | Tetramethylammonium hypochlorite (3.51 mass %, 0.28 mol/L) | Tetramethylammonium hydroxide (0.91 mass %, 0.0997 mol/L) |

TABLE 2

|  | Bromine-containing compound | Oxidizing agent | Basic compound |
|---|---|---|---|
| Example 21 | Tetramethylammonium bromide (0.02 mass %, 0.0013 mol/L) | Tetramethylammonium hypochlorite (1.25 mass %, 0.10 mol/L) | Tetramethylammonium hydroxide (0.09 mass %, 0.0097 mol/L) |
| Example 22 | Hydrogen bromide (1.62 mass %, 0.2 mol/L) | Tetramethylammonium hypochlorite (3.51 mass %, 0.28 mol/L) | Tetramethylammonium hydroxide (0.54 mass %, 0.2097 mol/L) |
| Example 23 | Trimethylsulfonium bromide (0.4 mass %, 0.05 mol/L) | Tetramethylammonium hypochlorite (3.51 mass %, 0.28 mol/L) | Tetramethylammonium hydroxide (0.09 mass %, 0.0097 mol/L) |
| Example 24 | Tetramethylammonium bromide (0.77 mass %, 0.05 mol/L) | Tetramethylammonium hypochlorite (3.51 mass %, 0.28 mol/L) | Tetramethylammonium hydroxide (0.09 mass %, 0.0097 mol/L) |
| Example 25 | Tetramethylammonium bromide (0.77 mass %, 0.05 mol/L) | Tetramethylammonium hypochlorite (3.51 mass %, 0.28 mol/L) | Tetramethylammonium hydroxide (0.09 mass %, 0.0097 mol/L) |
| Example 26 | Tetramethylammonium bromide (0.77 mass %, 0.05 mol/L) | Tetramethylammonium hypochlorite (3.51 mass %, 0.28 mol/L) | Tetramethylammonium hydroxide (0.09 mass %, 0.0097 mol/L) |
| Example 27 | Hydrogen bromide (0.4 mass %, 0.05 mol/L) | Tetramethylammonium hypochlorite (3.51 mass %, 0.28 mol/L) | Tetramethylammonium hydroxide (0.56 mass %, 0.06 mol/L) |
| Example 28 | Tetramethylammonium bromide (0.77 mass %, 0.05 mol/L) | Tetramethylammonium hypochlorite (3.51 mass %, 0.28 mol/L) | Tetramethylammonium hydroxide (0.27 mass %, 0.03 mol/L) |
| Example 29 | Tetramethylammonium bromide (0.77 mass %, 0.05 mol/L) | Tetramethylammonium hypochlorite (3.51 mass %, 0.28 mol/L) | Tetramethylammonium hydroxide (0.91 mass %, 0.0997 mol/L) |
| Example 30 | Tetramethylammonium bromide (3.85 mass %, 0.25 mol/L) | Tetramethylammonium hypochlorite (0.63 mass %, 0.05 mol/L) | Tetramethylammonium hydroxide (0.91 mass %, 0.0997 mol/L) |
| Example 31 | Tetramethylammonium bromide (0.77 mass %, 0.05 mol/L) | Orthoperiodic acid (1.14 mass %, 0.05 mol/L) | — |
| Example 32 | Tetramethylammonium bromide (0.77 mass %, 0.05 mol/L) | Orthoperiodic acid (5.0 mass %, 0.22 mol/L) | Tetramethylammonium hydroxide (4.0 mass %, 0.437 mol/L) |
| Example 33 | Tetramethylammonium bromide (0.77 mass %, 0.05 mol/L) | Tetramethylammonium hypochlorite (3.82 mass %, 0.305 mol/L) | Tetramethylammonium hydroxide (0.09 mass %, 0.0097 mol/L) |
| Example 34 | Tetramethylammonium bromide (0.77 mass %, 0.05 mol/L) | Tetramethylammonium hypochlorite (3.82 mass %, 0.305 mol/L) | Tetramethylammonium hydroxide (0.09 mass %, 0.0097 mol/L) |
| Example 35 | Tetramethylammonium bromide (0.77 mass %, 0.05 mol/L) | Tetramethylammonium hypochlorite (5.01 mass %, 0.40 mol/L) | Tetramethylammonium hydroxide (0.09 mass %, 0.0097 mol/L) |

TABLE 2-continued

|  | Bromine-containing compound | Oxidizing agent | Basic compound |
|---|---|---|---|
| Example 36 | Tetramethylammonium bromide (0.77 mass %, 0.05 mol/L) | Tetramethylammonium hypochlorite (3.01 mass %, 0.24 mol/L) | Tetramethylammonium hydroxide (0.09 mass %, 0.0097 mol/L) |
| Example 37 | Tetramethylammonium bromide (1.54 mass %, 0.10 mol/L) | Tetramethylammonium hypochlorite (4.0 mass %, 0.32 mol/L) | Tetramethylammonium hydroxide (0.09 mass %, 0.0097 mol/L) |
| Example 38 | Tetramethylammonium bromide (0.77 mass %, 0.05 mol/L) | Tetramethylammonium hypochlorite (3.51 mass %, 0.28 mol/L) | Tetramethylammonium hydroxide (0.09 mass %, 0.0097 mol/L) |
| Example 39 | Tetramethylammonium bromide (4.62 mass %, 0.3 mol/L) | Tetramethylammonium hypochlorite (3.51 mass %, 0.28 mol/L) | Tetramethylammonium hydroxide (0.09 mass %, 0.0097 mol/L) |
| Comparative Example 1 | — | Tetramethylammonium hypochlorite (3.51 mass %, 0.28 mol/L) | Tetramethylammonium hydroxide (0.09 mass %, 0.0097 mol/L) |
| Comparative Example 2 | — | Tetramethylammonium hypochlorite (3.51 mass %, 0.28 mol/L) | Tetramethylammonium hydroxide (0.91 mass %, 0.0997 mol/L) |
| Comparative Example 3 | — | Tetramethylammonium hypochlorite (3.51 mass %, 0.28 mol/L) | Tetramethylammonium hydroxide (0.001 mass %, 0.000068 mol/L) |

TABLE 3

|  | Water [mass %] | pH | Hypobromite ion [mol/l] | Hypobromite ion/Bromine element molar ratio |
|---|---|---|---|---|
| Example 1 | 95.63 | 12 | 0.05 | 1 |
| Example 2 | 96.25 | 12 | 0.01 | 1 |
| Example 3 | 94.86 | 12 | 0.1 | 1 |
| Example 4 | 97.89 | 12 | 0.05 | 1 |
| Example 5 | 94.81 | 13 | 0.05 | 1 |
| Example 6 | 95.69 | 11.5 | 0.05 | 1 |
| Example 7 | 95.71 | 11 | 0.05 | 1 |
| Example 8 | 93.74 | 12 | 0.1 | 1 |
| Example 9 | 96.13 | 12 | 0.01 | 1 |
| Example 10 | 91.78 | 12 | 0.28 | 0.93 |
| Example 11 | 88.70 | 12 | 0.28 | 0.56 |
| Example 12 | 95.45 | 12.5 | 0.05 | 1 |
| Example 13 | 97.01 | 12.8 | 0.08 | 1 |
| Example 14 | 96.30 | 12 | 0.006 | 1 |
| Example 15 | 96.01 | 12 | 0.025 | 1 |
| Example 16 | 93.70 | 12 | 0.18 | 1 |
| Example 17 | 99.71 | 12 | 0.01 | 0.2 |
| Example 18 | 92.85 | 13.5 | 0.05 | 1 |
| Example 19 | 95.36 | 12.5 | 0.05 | 1 |
| Example 20 | 95.43 | 13 | 0.005 | 1 |

TABLE 4

|  | Water [mass %] | pH | Hypobromite ion [mol/l] | Hypobromite ion/Bromine element molar ratio |
|---|---|---|---|---|
| Example 21 | 98.64 | 12 | 0.0013 | 1 |
| Example 22 | 94.33 | 12 | 0.2 | 1 |
| Example 23 | 96.00 | 12 | 0.05 | 1 |
| Example 24 | 95.63 | 12 | 0.05 | 1 |
| Example 25 | 95.63 | 12 | 0.05 | 1 |
| Example 26 | 95.63 | 12 | 0.05 | 1 |
| Example 27 | 95.53 | 12 | 0.05 | 1 |
| Example 28 | 95.45 | 12.5 | 0.05 | 1 |
| Example 29 | 94.81 | 13 | 0.05 | 1 |
| Example 30 | 94.61 | 13 | 0.05 | 0.2 |
| Example 31 | 98.09 | 11 | 0.05 | 0.001 |
| Example 32 | 90.23 | 11 | 0.05 | 0.0005 |
| Example 33 | 95.32 | 12 | 0.05 | 1 |
| Example 34 | 95.32 | 12 | 0.05 | 1 |
| Example 35 | 94.13 | 12 | 0.05 | 1 |
| Example 36 | 96.13 | 12 | 0.05 | 1 |
| Example 37 | 94.37 | 12 | 0.1 | 1 |
| Example 38 | 95.63 | 12 | 0.05 | 1 |
| Example 39 | 91.78 | 12 | 0.28 | 0.93 |
| Comparative Example 1 | 96.40 | 12 | — | — |
| Comparative Example 2 | 95.58 | 13 | — | — |
| Comparative Example 3 | 96.49 | 11 | — | — |

TABLE 5

|  | Treatment temperature (° C.) | Treatment time (sec) | Etching rate (Å/min) | Ru amount [μg/cm²] | Stability [hours] |
|---|---|---|---|---|---|
| Example 1 | 25 | 60 | 360 | 2.7 | 160 |
| Example 2 | 25 | 300 | 58 | 2.6 | >200 |
| Example 3 | 25 | 30 | 884 | 2.8 | 130 |
| Example 4 | 25 | 60 | 278 | 2.8 | 110 |
| Example 5 | 25 | 300 | 116 | 0 | 180 |
| Example 6 | 25 | 30 | 2412 | 18 | 100 |
| Example 7 | 25 | 30 | 2534 | 30 | 80 |
| Example 8 | 25 | 120 | 635 | 0 | 140 |
| Example 9 | 25 | 300 | 72 | 2.2 | >200 |
| Example 10 | 25 | 10 | 4263 | 2.7 | 30 |
| Example 11 | 25 | 10 | 4083 | 2.7 | 30 |
| Example 12 | 25 | 300 | 171 | 1.0 | 170 |
| Example 13 | 25 | 300 | 108 | 0 | 100 |
| Example 14 | 25 | 300 | 40 | 2.2 | >200 |
| Example 15 | 25 | 120 | 221 | 2.2 | 170 |
| Example 16 | 25 | 30 | 1108 | 2.2 | 110 |
| Example 17 | 25 | 300 | 25 | 2.6 | 180 |
| Example 18 | 25 | 300 | 40 | 0 | >200 |
| Example 19 | 25 | 60 | 150 | 1.0 | 150 |
| Example 20 | 60 | 60 | 50 | 1.3 | 50 |
| Example 21 | 60 | 60 | 20 | 5.8 | 20 |
| Example 22 | 25 | 60 | 355 | 2.7 | 160 |
| Example 23 | 25 | 60 | 270 | 2.5 | 45 |
| Example 24 | 25 | 60 | 356 | 2.6 | 162 |
| Example 25 | 25 | 60 | 361 | 2.8 | 158 |
| Example 26 | 25 | 60 | 359 | 2.8 | 161 |
| Example 27 | 25 | 60 | 358 | 2.7 | 160 |
| Example 28 | 25 | 300 | 175 | 0.9 | 165 |
| Example 29 | 25 | 300 | 112 | 0.0 | 185 |
| Example 30 | 25 | 300 | 75 | 0 | >200 |
| Example 31 | 25 | 300 | 85 | 31 | 95 |
| Example 32 | 25 | 300 | 25 | 29 | >200 |
| Example 33 | 25 | 60 | 361 | 2.7 | 172 |
| Example 34 | 25 | 60 | 362 | 2.6 | 171 |
| Example 35 | 25 | 60 | 358 | 2.8 | 191 |
| Example 36 | 25 | 60 | 350 | 2.7 | 160 |

TABLE 5-continued

|  | Treatment temperature (° C.) | Treatment time (sec) | Etching rate (Å/min) | Ru amount [μg/cm$^2$] | Stability [hours] |
|---|---|---|---|---|---|
| Example 37 | 25 | 60 | 110 | 2.5 | 130 |
| Example 38 | 25 | 60 | 370 | 2.6 | 200 |
| Example 39 | 25 | 10 | 4300 | 2.5 | 45 |
| Comparative Example 1 | 25 | 600 | 0 | — | — |
| Comparative Example 2 | 25 | 600 | 0 | — | — |
| Comparative Example 3 | 25 | 300 | 10 | 80 | 10 |

TABLE 6

| | Solution (A Liquid) containing oxidizing agent and basic compound | | |
|---|---|---|---|
| | Oxidizing agent | Basic compound | pH |
| Example 24 | Tetramethylammonium hypochlorite (4.39 mass %, 0.35 mol/L) | Tetramethylammonium hydroxide (0.09 mass %, 0.0097 mol/L) | 12 |
| Example 25 | Tetramethylammonium hypochlorite (11.66 mass %, 0.93 mol/L) | Tetramethylammonium hydroxide (0.09 mass %, 0.0097 mol/L) | 12 |
| Example 26 | Tetramethylammonium hypochlorite (4.39 mass %, 0.35 mol/L) | Tetramethylammonium hydroxide (0.09 mass %, 0.0097 mol/L) | 12 |
| Example 27 | Tetramethylammonium hypochlorite (4.39 mass %, 0.35 mol/L) | Tetramethylammonium hydroxide (0.70 mass %, 0.075 mol/L) | 12.8 |
| Example 28 | Tetramethylammonium hypochlorite (4.39 mass %, 0.35 mol/L) | Tetramethylammonium hydroxide (0.27 mass %, 0.03 mol/L) | 12.5 |
| Example 29 | Tetramethylammonium hypochlorite (4.39 mass %, 0.35 mol/L) | Tetramethylammonium hydroxide (0.91 mass %, 0.0997 mol/L) | 13 |
| Example 30 | Tetramethylammonium hypochlorite (0.788 mass %, 0.0625 mol/L) | Tetramethylammonium hydroxide (0.91 mass %, 0.0997 mol/L) | 13 |

| | Solution (B Liquid) containing bromine-containing compound | | |
|---|---|---|---|
| | Bromine-containing compound | Basic compound | pH |
| Example 24 | Tetramethylammonium bromide (3.85 mass %, 0.25 mol/L) | Tetramethylammonium hydroxide (0.09 mass %, 0.0097 mol/L) | 12 |
| Example 25 | Tetramethylammonium bromide (1.1 mass %, 0.071 mol/L) | Tetramethylammonium hydroxide (0.09 mass %, 0.0097 mol/L) | 12 |
| Example 26 | Tetramethylammonium bromide (3.85 mass %, 0.25 mol/L) | Tetramethylammonium hydroxide (0.09 mass %, 0.0097 mol/L) | 12 |
| Example 27 | hydrobromic acid (2.0 mass %, 0.25 mol/L) | | 0.6 |
| Example 28 | Tetramethylammonium bromide (3.85 mass %, 0.25 mol/L) | Tetramethylammonium hydroxide (0.27 mass %, 0.03 mol/L) | 12.5 |
| Example 29 | Tetramethylammonium bromide (3.85 mass %, 0.25 mol/L) | Tetramethylammonium hydroxide (0.91 mass %, 0.0997 mol/L) | 13 |
| Example 30 | Tetramethylammonium bromide (19.25 mass %, 1.25 mol/L) | Tetramethylammonium hydroxide (0.91 mass %, 0.0997 mol/L) | 13 |

| | Mixing ratio (A:B) | Mixing method | pH after mixing | Reaction time [min] |
|---|---|---|---|---|
| Example 24 | 4:01 | B was mixed into A | 12 | 5 |
| Example 25 | 1.5:3.5 | B was mixed into A | 12 | 5 |
| Example 26 | 4:01 | A was mixed into B | 12 | 5 |

TABLE 6-continued

| | | | | |
|---|---|---|---|---|
| Example 27 | 4:01 | B was mixed into A | 12 | 0 |
| Example 28 | 4:01 | B was mixed into A | 12.5 | 15 |
| Example 29 | 4:01 | B was mixed into A | 13 | 40 |
| Example 30 | 4:01 | B was mixed into A | 13 | 15 |

TABLE 7

| | 25% TMAH [g] | Ion exchanged water [g] | Cl2 supply amount [mL] | Reaction temperature [° C.] | CO2 in gas phase [ppm] | Hypochlorite ion concentration [%] | | pH before reaction step | pH immediately after production | Reaction efficiency [%] |
|---|---|---|---|---|---|---|---|---|---|---|
| | | | | | | immediately after production | 10 days later | | | |
| Example 33 | 253 | 747 | 6810 | 11 | <1 | 1.59 | 1.59 | 13.8 | 13.0 | 100 |
| Example 34 | 253 | 747 | 6810 | 11 | 50 | 1.59 | 1.59 | 13.8 | 12.5 | 100 |
| Example 35 | 339 | 661 | 9478 | 25 | <1 | 2.08 | 2.08 | 14.0 | 13.0 | 95 |

TABLE 8

| | Oxidation-reduction potential [V] | |
|---|---|---|
| pH | ClO—/Cl— | BrO—/Br— |
| 8 | 1.24 | 1.11 |
| 10 | 1.13 | 1.00 |
| 12 | 1.01 | 0.88 |
| 14 | 0.89 | 0.76 |

TABLE 9

| | Tetraalkylammonium hydroxide | Bromine ion source | Tetraalkylammonium bromide |
|---|---|---|---|
| Example 36 | Tetramethylammonium hydroxide (2.28 mass %, 0.25 mol/L) | Hydrogen bromide (2.02 mass %, 0.25 mol/L) | Tetramethylammonium bromide (3.85 mass %, 0.25 mol/L) |

What is claimed is:

1. A treatment liquid for a semiconductor with ruthenium, comprising a hypobromite ion, wherein the hypobromite ion content is 0.001 mol/L or more and 0.20 mol/L or less,
  wherein the treatment liquid has a pH of 12 or more and 14 or less, and
  wherein the ruthenium is a ruthenium metal.

2. The treatment liquid for a semiconductor according to claim 1, wherein the treatment liquid for a semiconductor further comprises an oxidizing agent, and the oxidation-reduction potential of the oxidizing agent exceeds the oxidation-reduction potential of the hypobromite ion/Br⁻ system.

3. The treatment liquid for a semiconductor according to claim 2, wherein the oxidizing agent contained in the treatment liquid for a semiconductor is a hypochlorite ion or ozone.

4. The treatment liquid for a semiconductor according to claim 1, further comprising a tetraalkylammonium ion.

5. The treatment liquid for a semiconductor according to claim 1, wherein the proportion of the hypobromite ion in 1 mol of bromine element contained in the treatment liquid for a semiconductor is more than 0.5 mol.

6. The treatment liquid for a semiconductor according to claim 2, wherein the proportion of the hypobromite ion in 1 mol of bromine element contained in the treatment liquid for a semiconductor is more than 0.5 mol.

* * * * *